(12) United States Patent
Yamazaki

(10) Patent No.: US 8,735,892 B2
(45) Date of Patent: May 27, 2014

(54) SEMICONDUCTOR DEVICE USING OXIDE SEMICONDUCTOR

(75) Inventor: Shunpei Yamazaki, Tokyo (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 13/336,784

(22) Filed: Dec. 23, 2011

(65) Prior Publication Data

US 2012/0161133 A1    Jun. 28, 2012

(30) Foreign Application Priority Data

Dec. 28, 2010   (JP) ................. 2010-293040

(51) Int. Cl.
  *H01L 29/04* (2006.01)
  *H01L 29/10* (2006.01)
  *H01L 31/00* (2006.01)

(52) U.S. Cl.
  USPC ............ 257/59; 257/72; 257/296; 257/291; 257/390; 438/128; 438/587

(58) Field of Classification Search
  USPC .......... 257/E27.06, 57, 59, 296, 288, 368, 72, 257/40, 291, 431, 390, 258, 202, 204; 438/46, 164, 197, 199, 455, 22, 24, 26, 438/45, 128, 587, 590
  See application file for complete search history.

(56) References Cited

U.S. PATENT DOCUMENTS

| | | | |
|---|---|---|---|
| 4,466,081 A | 8/1984 | Masuoka | |
| 5,112,765 A | 5/1992 | Cederbaum | |
| 5,349,366 A | 9/1994 | Yamazaki et al. | |
| 5,731,856 A | 3/1998 | Kim et al. | |
| 5,744,864 A | 4/1998 | Cillessen et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26. pp. 181-184.

(Continued)

*Primary Examiner* — Thanh Y Tran
(74) *Attorney, Agent, or Firm* — Fish & Richardson P.C.

(57) ABSTRACT

An object of one embodiment of the disclosed invention is to provide a semiconductor device having a novel structure in which stored data can be held even when power is not supplied and the number of times of writing is not limited. The semiconductor device is formed using an insulating layer formed over a supporting substrate and, over the insulating layer, a highly purified oxide semiconductor and single crystal silicon which is used as a sililcon on insulator (SOI). A transistor formed using a highly purified oxide semiconductor can hold data for a long time because leakage current thereof is extremely small. Further, by using an SOI substrate and utilizing features of thin single crystal silicon formed over an insulating layer, fully-depleted transistors can be formed; therefore, a semiconductor integrated circuit with high added values such as high integration, high-speed driving, and low power consumption can be obtained.

8 Claims, 13 Drawing Sheets

(56) References Cited

U.S. PATENT DOCUMENTS

| | | |
|---|---|---|
| 6,294,274 B1 | 9/2001 | Kawazoe et al. |
| 6,314,017 B1 | 11/2001 | Emori |
| 6,445,026 B1 | 9/2002 | Kubota |
| 6,563,174 B2 | 5/2003 | Kawasaki et al. |
| 6,717,180 B2 | 4/2004 | Yamazaki |
| 6,727,522 B1 | 4/2004 | Kawasaki et al. |
| 6,933,201 B2 | 8/2005 | Tominari |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,468,901 B2 | 12/2008 | Kameshiro |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,339,828 B2 | 12/2012 | Yamazaki |
| 8,378,341 B2 | 2/2013 | Hayashi |
| 8,400,817 B2 | 3/2013 | Yamazaki |
| 8,450,783 B2 | 5/2013 | Yamazaki |
| 8,455,868 B2 | 6/2013 | Yamazaki |
| 8,482,001 B2 | 7/2013 | Yamazaki |
| 8,559,220 B2 | 10/2013 | Yamazaki |
| 2001/0046027 A1 | 11/2001 | Tai et al. |
| 2002/0056838 A1 | 5/2002 | Ogawa |
| 2002/0096702 A1 | 7/2002 | Ishii |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0237786 A1 | 10/2005 | Atwood |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0063287 A1 | 3/2007 | Sano |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0004878 A1* | 1/2009 | Ohnuma et al. .............. 438/759 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi |
| 2010/0193785 A1 | 8/2010 | Kimura |
| 2011/0101334 A1 | 5/2011 | Yamazaki et al. |
| 2011/0101351 A1 | 5/2011 | Yamazaki |
| 2011/0122673 A1 | 5/2011 | Kamata et al. |
| 2011/0134683 A1 | 6/2011 | Yamazaki et al. |
| 2011/0147737 A1 | 6/2011 | Yamazaki et al. |
| 2012/0025284 A1* | 2/2012 | Kato et al. ............... 257/296 |
| 2012/0056861 A1* | 3/2012 | Kurokawa et al. ............ 345/207 |

FOREIGN PATENT DOCUMENTS

| | | |
|---|---|---|
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |
| WO | 2009/096608 A1 | 8/2009 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Trans-

(56) References Cited

OTHER PUBLICATIONS actions on Electron Devices, Jul. 1, 1995, vol. 42, No. 7, pp. 1240-1246.
Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.
Clark, S et al., "First Principles Methods Using Castep," Zeitschrift fur Kristallographie, 2005, vol. 220, pp. 567-570.
Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.
Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTs) for AMLCDS," Journal of the sSID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda., T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancles in ZnO," Appl. Phys. Lett. (Applied Physics Letters), 2005, vol. 87, pp. 122102-1-122102-3.
Jeon, S et al., "180nm Gate Length Amorphous InGaZnO Thin Film Transistor for High Density Image Sensor Applications," IEDM 10: Technical Digest of International Electron Devices Meeting, Dec. 6, 2010, pp. 504-507.
Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," The Electrochemical Society, 214th ECS Meeting, 2008, No. 2317, 1 page.
Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.
Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUS on Flexible and Glass Substrates for Secure RFID Systems," Journal of Solid-State Circuits , 2008, vol. 43, No. 1, pp. 292-299.
Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current Status of, Challenges to, and Perspective View of AM-OLED," IDW '06 : Proceedings of the 13th International Display Workshops, Dec. 7, 2006, pp. 663-666.
Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.
Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.
Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.
Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Meiboom, S et al., "Theory of the Blue Phase of Cholesteric Liquid Crystals," Phys. Rev. Lett. (Physical Review Letters), May 4, 1981, vol. 46, No. 18, pp. 1216-1219.
Miyasaka, M, "Suftla Flexible Microelectronics on Their Way to Business," SID Digest '07 : SID International Symposium Digest of Technical Papers, 2007, vol. 38, pp. 1673-1676.
Mo, Y et al., "Amorphous Oxide TFT Backplanes for Large Size AMOLED Displays," IDW '08 : Proceedings of the 6th International Display Workshops, Dec. 3, 2008, pp. 581-584.
Nakamura, "Synthesis of Homologous Compound with New Long-Period Structure," NIRIM Newsletter, Mar. 1995, vol. 150, pp. 1-4 with English translation.
Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

(56) References Cited

OTHER PUBLICATIONS

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTs With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, Vol, 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTs," IDW '09 : Proceedings of the 16th International Display Workshops, 2009, pp. 689-692

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Kenji Nomura et al.; "Room-temperature fabrication of transparent flexible thin-film transistors using amorphous oxide semiconductors"; Nature; Nov. 25, 2004; pp. 488-492; vol. 432.

Kenji Nomura et al.; "Thin-Film Transistor Fabricated in Single-Crystalline Transparent Oxide Semiconductor"; Science; May 23, 2003; pp. 1269-1272; vol. 300, No. 5623.

N. Kameshiro et al.; "A Fully Logic-Process-Compatible, 3-Transistor, SESO-memory Cell Featuring 0.1-FIT/MB Soft Error, 100-MHz Random Cycle, and 100-ms Retention"; 2008 Symposium on VLSI Circuits Digest of Technical Papers; Aug. 1, 2008; pp. 122-123.

\* cited by examiner

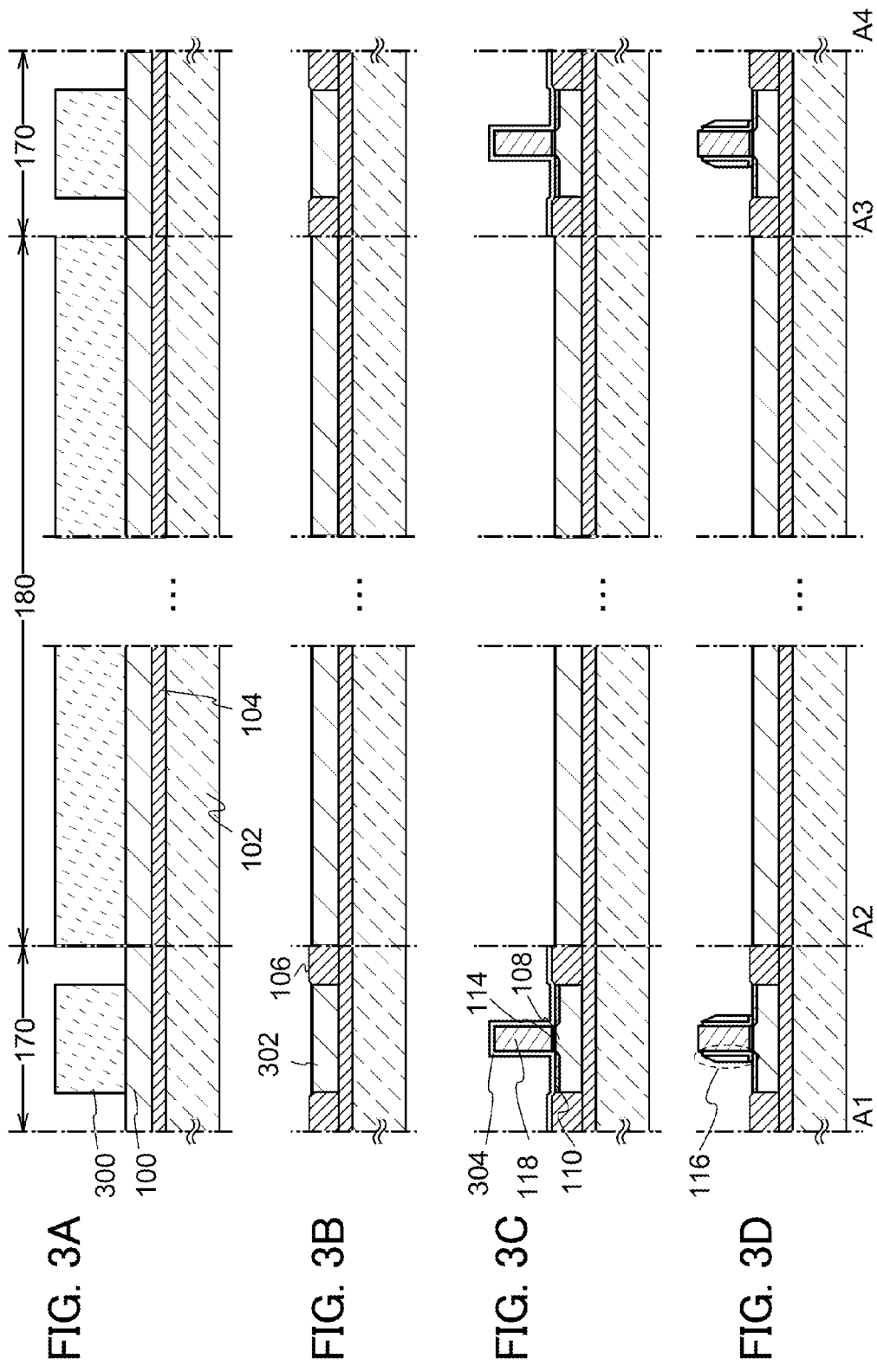

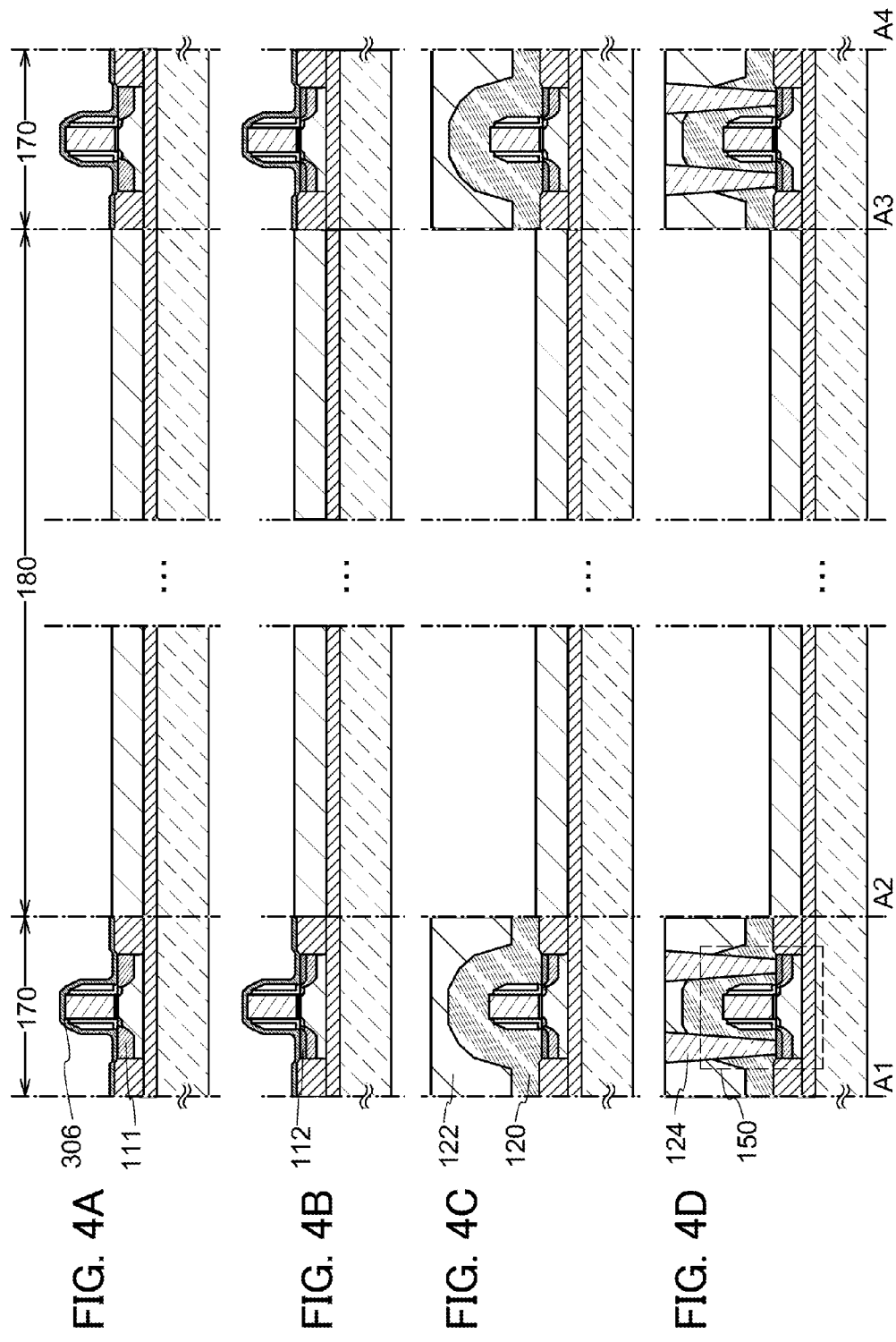

SEMICONDUCTOR DEVICE USING OXIDE SEMICONDUCTOR

BACKGROUND OF THE INVENTION

1. Field of the Invention

The disclosed invention relates to a semiconductor device using a semiconductor element.

2. Description of the Related Art

Memory devices using semiconductor elements are broadly classified into two categories: a volatile device that loses stored data when power supply stops, and a non-volatile device that holds stored data even when power is not supplied.

A typical example of a volatile memory device is a dynamic random access memory (DRAM). A DRAM holds data in such a manner that a transistor included in a memory element is selected and electric charge is held in a capacitor.

When data is read from a DRAM, electric charge in a capacitor is lost according to the above-described principle; thus, another writing operation is necessary whenever data is read. Moreover, a transistor included in a memory element has a leakage current and electric charge flows into or out of a capacitor even when the transistor is not selected, so that the data holding time is short. For that reason, another writing operation (refresh operation) is necessary at predetermined intervals, and it is difficult to sufficiently reduce power consumption. Furthermore, since stored data is lost when power supply stops, an additional memory device using a magnetic material or an optical material is needed in order to hold the data for a long time.

Another example of a volatile memory device is a static random access memory (SRAM). An SRAM holds stored data by using a circuit such as a flip-flop and thus does not require refresh operation. This means that an SRAM has an advantage over a DRAM. However, cost per memory capacity is increased because a circuit such as a flip-flop is used. Moreover, as in a DRAM, stored data in an SRAM is lost when power supply stops.

A typical example of a non-volatile memory device is a flash memory. A flash memory includes a floating gate between a gate electrode and a channel formation region in a transistor and holds data by holding electric charge in the floating gate. Therefore, a flash memory has advantages in that the data holding time is extremely long (semi-permanent) and refresh operation which is necessary in a volatile memory device is not needed (e.g., see Patent Document 1).

However, a gate insulating layer included in a memory element deteriorates by tunneling current generated in writing, so that the memory element stops its function after a predetermined number of writing operations. In order to reduce adverse effects of this problem, a method in which the number of writing operations for memory elements is equalized is employed, for example. However, a complicated peripheral circuit is needed to realize this method. Moreover, employing such a method does not solve the fundamental problem of deterioration. In other words, a flash memory is not suitable for applications in which data is frequently rewritten.

In addition, high voltage is necessary for injection of charge in the floating gate or removal of the charge, and a circuit for generating high voltage is also necessary. Further, it takes a relatively long time to hold or remove electric charge, and it is not easy to perform writing and erasing at higher speed.

Reference

[Patent Document 1] Japanese Published Patent Application No. S57-105889

SUMMARY OF THE INVENTION

In view of the foregoing problems, an object of one embodiment of the disclosed invention is to provide a semiconductor device in which stored data can be held even when power is not supplied and in which there is no limitation on the number of times of writing.

In the disclosed invention, a semiconductor device is formed using an insulating layer formed over a supporting substrate and, over the insulating layer, a highly purified oxide semiconductor and single crystal silicon which is used as a silicon on insulator (SOI) substrate. A transistor formed using a highly purified oxide semiconductor can hold data for a long time because leakage current thereof is extremely small. Further, by using an SOI substrate and utilizing features of thin single crystal silicon formed over an insulating layer, fully-depleted transistors can be formed; therefore, a semiconductor integrated circuit with high added values such as high integration, high-speed driving, and low power consumption can be obtained. Details thereof will be described below.

One embodiment of the disclosed invention is a semiconductor device including a supporting substrate; an insulating layer formed over the supporting substrate; and a driver circuit and a memory element formed over the insulating layer. The driver circuit includes a first transistor formed using single crystal silicon. The memory element includes a second transistor formed using an oxide semiconductor including a channel formation region and impurity regions formed over and in contact with the insulating layer, source and drain electrodes provided over the oxide semiconductor, a gate insulating layer provided over the oxide semiconductor and the source and drain electrodes, and a gate electrode provided over the gate insulating layer. The first transistor and the second transistor are electrically connected to each other.

Another embodiment of the disclosed invention is a semiconductor device including a supporting substrate; an insulating layer formed over the supporting substrate; and a driver circuit and a memory element formed over the insulating layer. The driver circuit includes a first transistor formed using single crystal silicon. The memory element includes a second transistor including a gate electrode formed over and in contact with the insulating layer, a gate insulating layer provided over the gate electrode, an oxide semiconductor including a channel formation region and impurity regions provided over the gate insulating layer, source and drain electrodes provided over the oxide semiconductor, and a protective insulating layer formed to overlap with the channel formation region. The first transistor and the second transistor are electrically connected to each other.

Another embodiment of the disclosed invention is a semiconductor device including a supporting substrate; an insulating layer formed over the supporting substrate; and a driver circuit, a memory element, and a capacitor formed over the insulating layer. The driver circuit includes a first transistor formed using single crystal silicon. The memory element includes a second transistor formed using an oxide semiconductor including a channel formation region and impurity regions formed over and in contact with the insulating layer, source and drain electrodes provided over the oxide semiconductor, a gate insulating layer provided over the oxide semiconductor and the source and drain electrodes, and a gate electrode provided over the gate insulating layer. The capacitor includes the impurity regions, the insulating layer, and the supporting substrate. The first transistor and the second transistor are electrically connected to each other.

Another embodiment of the disclosed invention is a semiconductor device including a supporting substrate; an insulating layer formed over the supporting substrate; and a driver circuit, a memory element, and a capacitor formed over the insulating layer. The driver circuit includes a first transistor formed using single crystal silicon. The memory element includes a second transistor including a gate electrode formed over and in contact with the insulating layer, a gate insulating layer provided over the gate electrode, an oxide semiconductor including a channel formation region and impurity regions provided over the gate insulating layer, source and drain electrodes provided over the oxide semiconductor, and a protective insulating layer formed to overlap with the channel formation region. The capacitor includes the gate electrode, the insulating layer, and the supporting substrate. The first transistor and the second transistor are electrically connected to each other.

Further, in the above structure, the first transistor can have a structure in which a channel formation region including single crystal silicon, impurity regions provided so as to sandwich the channel formation region therebetween, a gate insulating layer over the channel formation region, the gate electrode over the gate insulating layer, and the source and drain electrodes which are electrically connected to the impurity regions are included.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be used to denote the drain and the source, respectively, in this specification.

Note that in this specification and the like, the term "electrically connected" includes the case where components are connected through an object having any electric function. There is no particular limitation on an object having any electric function as long as electric signals can be transmitted and received between components that are connected through the object.

Examples of an "object having any electric function" are a switching element such as a transistor, a resistor, an inductor, a capacitor, and an element with a variety of functions as well as an electrode and a wiring.

One embodiment of the present invention provides a semiconductor device relating to a transistor formed using single crystal silicon which is used as an SOI substrate and a transistor formed using an oxide semiconductor. Since the off-state current of a transistor formed using an oxide semiconductor is extremely low, stored data can be held for an extremely long time by using the transistor. That is, power consumption can be sufficiently reduced because refresh operation becomes unnecessary or the frequency of refresh operation can be extremely low. Accordingly, stored data can be held for a long time even when power is not supplied.

Further, with a transistor using an SOI substrate and utilizing features of thin single crystal silicon formed over an insulating layer, fully-depleted transistors can be formed; therefore, a semiconductor integrated circuit with high added values such as high integration, high-speed driving, and low power consumption can be obtained.

By forming the transistor formed using an oxide semiconductor over the supporting substrate, a capacitance can be formed between the supporting substrate and the transistor. Therefore, it is not required to form a capacitor in the plane direction, so that the circuit size can be reduced.

Further, in a semiconductor device according to one embodiment of the disclosed invention, high voltage is not needed to write data and there is no problem of deterioration of elements. For example, since there is no need to perform injection of electrons to a floating gate and extraction of electrons from the floating gate which are needed in a conventional nonvolatile memory, deterioration of a gate insulating layer does not occur. That is, the semiconductor device according to one embodiment of the disclosed invention does not have a limit on the number of times of writing which is a problem in a conventional nonvolatile memory, and reliability thereof is drastically improved. Furthermore, data is written depending on the on state and the off state of the transistor, whereby high-speed operation can be easily realized. In addition, operation for erasing data is not needed.

Since operation can be performed at sufficiently high speed with a transistor formed using single crystal silicon which is used as an SOI substrate, when the transistor is combined with a transistor formed using an oxide semiconductor, operation (e.g., data reading) can be performed at sufficiently high speed with a semiconductor device. Further, a transistor using an SOI substrate can favorably realize a variety of circuits (e.g., a logic circuit or a driver circuit) which needs to operate at high speed.

Accordingly, a semiconductor device "with a novel feature" can be obtained by including both a peripheral circuit, such as a driving circuit, including a transistor formed using single crystal silicon which is used as an SOI substrate and a memory element including a transistor formed using an oxide semiconductor (in a wider sense, a transistor whose off-state current is sufficiently low).

BRIEF DESCRIPTION OF THE DRAWINGS

In the accompanying drawings:

FIGS. 3A to 3D are cross-sectional views relating to manufacturing steps of a semiconductor device;

FIGS. 4A to 4D are cross-sectional views relating to manufacturing steps of a semiconductor device;

DETAILED DESCRIPTION OF THE INVENTION

Figure 1A:
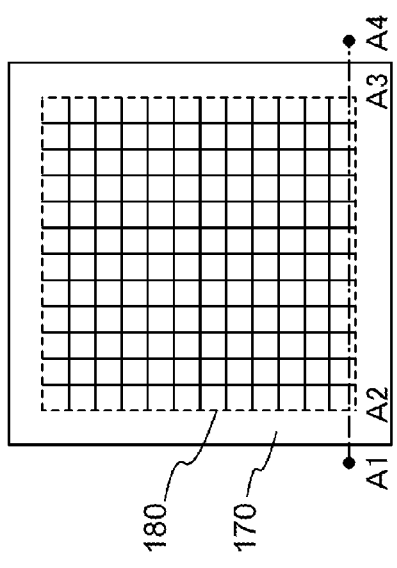
FIGS. 1A and 1B are a plan view and a cross-sectional view of a semiconductor device.

Hereinbelow, examples of embodiments of the present invention will be described with reference to the drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiments.

Note that the position, size, range, or the like of each structure shown in drawings and the like is not accurately represented in some cases for easy understanding. Therefore, the disclosed invention is not necessarily limited to the position, size, range, or the like as disclosed in the drawings and the like.

It is to be noted that in this specification and the like, ordinal numbers such as "first", "second", and "third" are used in order to avoid confusion among components, and the terms do not mean limitation of the number of components.
(Embodiment 1)

In this embodiment, a structure of a semiconductor device according to an embodiment of the disclosed invention will be described with reference to FIGS. 1A and 1B and FIG. 2. Note that in each of circuit diagrams, in some cases, "OS" is written beside a transistor in order to indicate that the transistor includes an oxide semiconductor.
<Planar Structure and Cross-Sectional Structure of Semiconductor Device>

Figure 1B:
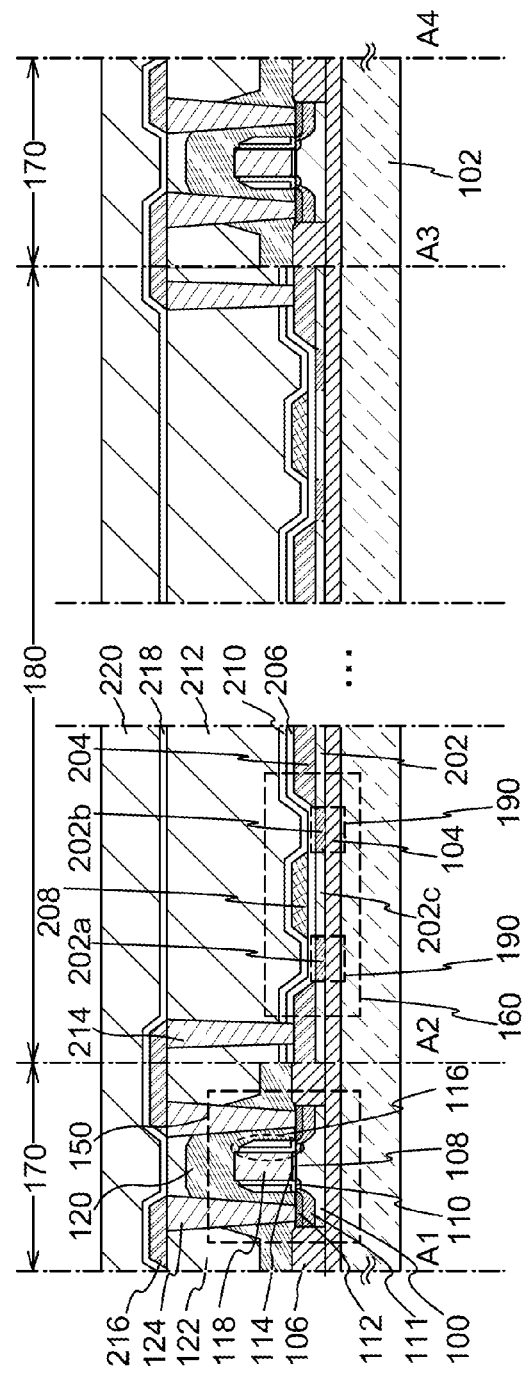

FIG. 1A is a plan view of a semiconductor device, and FIG. 1B is a cross-sectional view taken along line A1-A4 of FIG. 1A. In the cross sectional view taken along dashed line A1-A4, A2 and A3 are shown in order to clearly show the positional relation. The semiconductor device shown in FIGS. 1A and 1B includes a peripheral circuit 170 and a memory element 180 (also referred to as a memory cell array). The peripheral circuit 170 includes a transistor 150 each formed using single crystal silicon which is used as an SOI substrate, and the memory element 180 includes a transistor 160 each formed using an oxide semiconductor. A transistor formed using single crystal silicon can operate at high speed easily. On the other hand, a transistor formed using an oxide semiconductor can hold charge for a long time owing to its characteristics.

Further, in the memory element 180, memory cells each including the transistor 160 are provided in matrix to form a memory cell array.

Although all the transistors are described as n-channel transistors here, it is needless to say that p-channel transistors can be used. Since the technical nature of the disclosed invention is to form the transistors 160 each formed using an oxide semiconductor in the memory element for storing data, it is not necessary to limit a specific structure of the semiconductor device to the structure described here.

Here, the structure of the transistor 150 in the peripheral circuit 170 and the structure of the transistor 160 included in the memory element 180 in FIG. 1B will be described.

<Structure of Transistor in Peripheral Circuit>

The transistor 150 includes a BOX layer 104 provided over a supporting substrate 102; a substrate 100 including a channel formation region 108 and provided over the BOX layer 104; a channel formation region 108; impurity regions 110 and high-concentration impurity regions 111 which are provided so that the channel formation region 108 is sandwiched therebetween (also, those are collectively referred to simply as impurity regions); a gate insulating layer 114 provided over the channel formation region 108; a gate electrode 118 provided over the gate insulating layer 114; and source and drain electrodes 124 electrically connected to the impurity region.

Here, sidewall insulating layers 116 are provided on side surfaces of the gate electrode 118. The high-concentration impurity regions 111 and metal compound regions 112 which are placed in contact with the high-concentration impurity regions 111 are provided in regions of the supporting substrate 102 which do not overlap with the sidewall insulating layers 116 when seen from the direction perpendicular to a surface of the supporting substrate 102. Further, element isolation insulating layers 106 are provided over the substrate 100 including the channel formation region 108 so as to surround the transistor 150. Further, a first insulating layer 120 and a second insulating layer 122 are provided so as to cover the transistor 150. The source and drain electrodes 124 are electrically connected to the metal compound regions 112 through openings formed in the first insulating layer 120 and the second insulating layer 122. That is, the source and drain electrodes 124 are electrically connected to the high-concentration impurity regions 111 and the impurity regions 110 through the metal compound regions 112. Further, connecting electrodes 216 are electrically connected to the gate electrode 118 through openings formed in the first insulating layer 120 and the second insulating layer 122. Note that in some cases, the sidewall insulating layers 116 are not formed in order to achieve higher integration or the like of the transistor 150.
<Structure of Transistor in Memory Element>

The transistor 160 includes the BOX layer 104 provided over the supporting substrate 102, an oxide semiconductor 202 provided over the BOX layer 104, source and drain electrodes 204 provided over the oxide semiconductor 202, a gate insulating layer 206 provided in contact with the oxide semiconductor 202 and the source and drain electrodes 204, and a gate electrode 208 provided over the gate insulating layer 206.

The transistor 160 with such a structure can be referred to as a so-called top-gate top-contact (TGTC) transistor because of the positions of a gate electrode and a contact portion (a contact of an oxide semiconductor and source and drain electrodes).

The oxide semiconductor 202 includes an impurity region 202a, an impurity region 202b, and a channel formation region 202c. The impurity regions 202a and 202b can be formed as follows: impurities are implanted into the oxide semiconductor 202 by impurity implantation treatment with the source and drain electrodes 204 and the gate electrode 208 are used as a mask. A third insulating layer 210 and a fourth insulating layer 212 are provided so as to cover the transistor 160. The source and drain electrodes 204 are electrically connected to an electrode 214 through openings formed in the gate insulating layer 206, the third insulating layer 210, and the fourth insulating layer 212.

The resistance of the oxide semiconductor 202 is lowered by implanting impurities; therefore, the impurity regions 202a and 202b can also be referred to as low-resistance regions (also referred to as n-type regions). Accordingly, the BOX layer 104 over the supporting substrate 102 serves as a dielectric, and a capacitor 190 includes the supporting substrate 102, the BOX layer 104, and the low-resistance regions.

Note that the transistors 150 and 160 are electrically connected to each other by the connecting electrodes 216. Further, the fifth insulating layer 218 and the sixth insulating layer 220 are formed over the second insulating layer 122, the fourth insulating layer 212, and the connecting electrodes 216.

Here, the oxide semiconductor 202 is preferably highly purified by sufficiently removing impurities such as hydrogen or the like or by sufficiently supplying oxygen. Specifically, the concentration of hydrogen in the oxide semiconductor 202 is lower than or equal to $5 \times 10^{19}$ atoms/cm$^3$, preferably lower than or equal to $5 \times 10^{18}$ atoms/cm$^3$, more preferably lower than or equal to $5 \times 10^{17}$ atoms/cm$^3$, for example. Note that the above concentration of hydrogen in the oxide semiconductor 202 is measured by secondary ion mass spectrometry (SIMS). The carrier concentration of the oxide semiconductor 202, in which hydrogen is reduced to a sufficiently low concentration so that the oxide semiconductor is highly purified and in which defect states in an energy gap due to oxygen deficiency are reduced by sufficiently supplying oxygen as described above, is lower than $1 \times 10^{12}$/cm$^3$, preferably lower than $1 \times 10^{11}$/cm$^3$, more preferably lower than $1.45 \times 10^{10}$/cm$^3$. For example, the off-state current (here, current per micrometer of channel width) at room temperature is less than or equal to 100 zA/μm (1 zA (zeptoampere) is $1 \times 10^{-21}$ A), preferably less than or equal to 10 zA/μm. In such a manner, by using an i-type (intrinsic) or substantially i-type oxide semiconductor, the transistor 160 having extremely favorable off-state current characteristics can be obtained.

Note that since the oxide semiconductor 202 is not patterned to have an island shape in the transistor 160 shown in FIG. 1B, the oxide semiconductor 202 is prevented from being contaminated by etching for patterning. However, the shape of the oxide semiconductor 202 is not limited thereto. The oxide semiconductor 202 may be patterned to have an island shape.

The impurity regions 202a and 202b provided in the oxide semiconductor 202 are not required to be highly purified because impurities are implanted thereto intentionally. However, the concentration of hydrogen in the oxide semiconductor 202 is preferably in the above condition in order to eliminate the possibility of diffusion of impurity elements from the impurity regions 202a and 202b to the channel formation region 202c. In particular, in the case where the channel length is 200 nm or shorter, the concentration of hydrogen in the impurity regions 202a and 202b is preferably in the above condition in order to improve reliability.

Note that in the transistor 160, the end portions of the source and drain electrodes 204 are preferably tapered. Here, a taper angle is, for example, greater than or equal to 30° and less than or equal to 60°. Note that the taper angle is a tilt angle formed by a side surface and a bottom surface of a layer (e.g., the source and drain electrodes 204) having a tapered shape in the case where the layer is observed from the direction perpendicular to the cross section (a plane perpendicular to the surface of a substrate).

Figure 2:
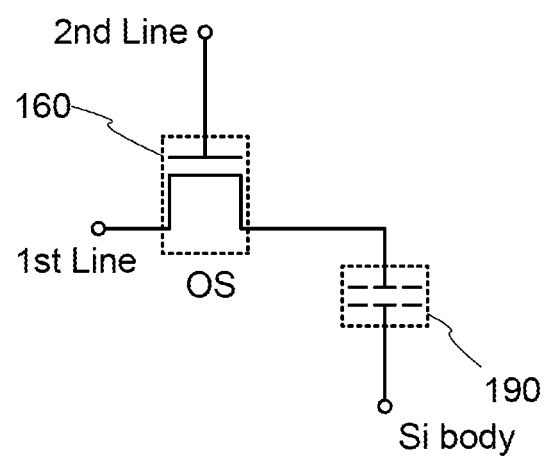
FIG. 2 is a circuit diagram of a semiconductor device.

Next, FIG. 2 shows a circuit configuration of the semiconductor device in the memory element 180 shown in FIGS. 1A and 1B.

<Circuit Configuration of Memory Element>

In the circuit configuration of the semiconductor device shown in FIG. 2, a first wiring (also referred to as a 1st line or a first signal line) and one of the source and drain electrodes of the transistor 160 are electrically connected to each other. A second wiring (also referred to as a 2nd line or a second signal line) and the gate electrode of the transistor 160 are electrically connected to each other. Further, the other of the source and drain electrodes of the transistor 160 and one electrode of the capacitor 190 are electrically connected to each other. A supporting substrate (also referred to as a Si body or a third signal line) and the other electrode of the capacitor 190 are electrically connected to each other.

Note that the capacitor 190 includes the BOX layer 104 as a dielectric between the supporting substrate 102 and the impurity regions 202a and 202b of the transistor 160. The capacitor 190 formed in such a way can have extremely small capacitance. Thus, the capacitor 190 is shown by a dashed line in FIG. 2.

Here, a transistor formed using the above oxide semiconductor is used as the transistor 160. A transistor using the above described oxide semiconductor has a characteristic of extremely small off-state current. Therefore, when the transistor 160 is turned off, the potential supplied to the capacitor 190 can be held for an extremely long time. Note that the transistor 160 formed using an oxide semiconductor has characteristics of low power consumption and extremely high-speed operation because the channel length (L) thereof is longer than or equal to 10 nm and shorter than or equal to 1000 nm.

The circuit configuration of the semiconductor device shown in FIG. 2 utilizes a characteristic in which the potential supplied to the capacitor 190 can be held, whereby writing, storing, and reading of data can be performed as follows.

First, writing and holding of data will be described. The potential of the second wiring is set to potential which allows the transistor 160 to be turned on, so that the transistor 160 is turned on. In this manner, the potential of the first wiring is supplied to the one electrode of the capacitor 190. That is, predetermined charge is given to the capacitor 190 (writing). After that, the potential of the second wiring is set to potential which allows the transistor 160 to be turned off, so that the transistor 160 is turned off. Thus, the charge given to the capacitor 190 is held (storing). The transistor 160 has extremely small off-state current as described above and thus can hold charge for a long time.

Next, reading of data will be described. By setting the potential of the second wiring to potential which allows the transistor 160 to be turned on while predetermined potential (constant potential) is supplied to the first wiring, the potential of the first wiring varies depending on the amount of charge held in the capacitor 190. Therefore, the stored data can be read by the potential of the first wiring.

Since the charge of the capacitor 190 is lost in the case where the data is read, it is to be noted that another writing of data is performed.

Next, rewriting of data will be described. Rewriting of data is performed in a manner similar to that of the writing and holding of data. That is, the potential of the second wiring is set to potential which allows the transistor 160 to be turned on, so that the transistor 160 is turned on. Accordingly, the potential of the first wiring (potential related to new data) is supplied to the one electrode of the capacitor 190. After that, the potential of the second wiring is set to potential which allows the transistor 160 to be turned off, so that the transistor 160 is turned off. Accordingly, charge related to new data is given to the capacitor 190.

In the semiconductor device according to the invention disclosed herein, data can be directly rewritten by another writing of data as described above. Therefore, high-speed operation of the semiconductor device can be obtained.

Note that an n-channel transistor in which electrons are majority carriers is used in the above description; it is needless to say that a p-channel transistor in which holes are majority carriers can be used instead of the n-channel transistor.

As described above, the transistor 150 formed using single crystal silicon which is used as an SOI substrate in the peripheral circuit 170 and the transistor 160 formed using an oxide semiconductor in the memory element 180 are provided over the BOX layer 104 which is formed over the supporting substrate 102.

Accordingly, a semiconductor device with a novel feature can be obtained by including both a transistor formed using single crystal silicon which is used as an SOI substrate in a peripheral circuit and a transistor formed using an oxide semiconductor in a memory element.

Since the off-state current of the transistor 160 formed using an oxide semiconductor is extremely low, stored data can be held for an extremely long time by using the transistor. In other words, power consumption can be sufficiently reduced because refresh operation becomes unnecessary or the frequency of refresh operation can be extremely low. Accordingly, stored data can be held for a long time even when power is not supplied.

Further, by using single crystal silicon which is used as an SOI substrate and utilizing features of a thin single crystal silicon layer formed over an insulating layer, a semiconductor integrated circuit with high added values such as high integration, high-speed driving, and low power consumption can be obtained.

A capacitor can be formed using a supporting substrate, an insulating layer provided over the supporting substrate, and a transistor formed using an oxide semiconductor over the insulating layer. Therefore, it is not required to form a capacitor in the plane direction, so that the circuit size can be reduced.

The methods and structures described in this embodiment can be combined as appropriate with any of the methods and structures described in the other embodiments.

(Embodiment 2)

In this embodiment, an example of a manufacturing method for the semiconductor device described in Embodiment 1 will be described with reference to FIGS. 3A to 3D, FIGS. 4A to 4D, FIGS. 5A to 5C, and FIG. 6. Hereinafter, first, a manufacturing method for the transistor 150 included in the peripheral circuit 170 will be described with reference to FIGS. 3A to 3D and FIGS. 4A to 4D. After that, a manufacturing method for the transistor 160 included in the memory element 180 will be described with reference to FIGS. 5A to 5C. Further, a method for connecting the transistor 150 in the peripheral circuit 170 to the transistor 160 included in the memory element 180 will be described with reference to FIG. 6.

<Manufacturing Method for Transistor in Peripheral Circuit>

First, the top surface of the supporting substrate 102 is oxidized, so that the BOX layer 104 formed of a silicon oxide film which is an insulating layer having a thickness of 10 nm to 1000 nm over the top surface is formed (FIG. 3A). Note that the BOX layer is a so-called oxide layer buried in a substrate, and is also referred to as a buried oxide layer, a buried oxide film layer, a buried insulating film, and the like.

The BOX layer 104 can be formed by performing heat treatment on the supporting substrate 102 in an oxidizing atmosphere (hereinafter, referred to as thermal oxidation treatment). The thermal oxidation treatment may be performed by general dry oxidation; however, it is preferable that the oxidation be performed in an oxidizing atmosphere to which halogen is added. By performing the oxidation in an oxidizing atmosphere to which halogen is added, halogen can be included in the BOX layer 104. As gas for adding halogen into an oxidizing atmosphere, HCl can be used. As an example of the thermal oxidation treatment, thermal oxidation can be performed in an atmosphere which contains HCl at a proportion of 0.5 vol % to 10 vol % (preferably 3 vol %) with respect to oxygen at a temperature of 900° C. to 1150° C. (typically 1000° C.). Processing time may be set at 0.1 hours to 6 hours, preferably 0.5 hours to 1 hour.

As the supporting substrate 102, a single crystal semiconductor substrate or a polycrystalline semiconductor substrate containing silicon, silicon carbide, or the like, or a compound semiconductor substrate containing gallium arsenide, indium phosphide, silicon germanium, or the like can be used.

Next, the substrate 100 including a semiconductor material that differs from that of the supporting substrate 102 is prepared. As the substrate 100 including a semiconductor material, a single crystal semiconductor substrate or a polycrystalline semiconductor substrate containing silicon, silicon carbide, or the like; a compound semiconductor substrate containing silicon germanium or the like; an SOI substrate; or the like can be used. Here, an example of using a single crystal silicon substrate as the substrate 100 including a semiconductor material will be described. Note that in general, the term "SOI substrate" means a substrate in which a silicon semiconductor layer is provided on an insulating surface. In this specification and the like, the term "SOI substrate" also includes a substrate in which a semiconductor layer formed using a material other than silicon is provided over an insulating surface in its category. That is, a semiconductor layer included in the "SOI substrate" is not limited to a silicon semiconductor layer.

Next, the substrate 100 and the BOX layer 104 formed over the supporting substrate 102 are bonded. This bonding can be performed by a known bonding technique for an SOI substrate.

As the supporting substrate 102, the BOX layer 104, and the substrate 100, a substrate formed by SIMOX (separation by implanted oxygen) that is a known technique (SIMOX substrate) on which processing (grinding treatment, polishing treatment, or the like) is performed may be used.

Next, a protective layer 300 serving as a mask for forming an element isolation insulating layer is formed over the substrate 100 (see FIG. 3A). As the protective layer 300, an insulating layer formed using silicon oxide, silicon nitride, silicon oxynitride, or the like can be used, for example. Note that before or after this step, impurity elements imparting n-type conductivity or impurity elements imparting p-type conductivity may be added to the substrate 100 in order to control the threshold voltage of the transistor. When the semiconductor is formed using silicon, phosphorus, arsenic, or the like can be used as the impurities imparting n-type conductivity. Boron, aluminum, gallium, or the like can be used as the impurities imparting p-type conductivity.

Next, part of the substrate 100 in a region that is not covered with the protective layer 300 (in an exposed region) is removed by etching with the use of the protective layer 300 as a mask. Thus, a semiconductor region 302 separated from other semiconductor regions is formed (see FIG. 3B). As the etching, dry etching is preferably performed, but wet etching may be performed. An etching gas and an etchant can be selected as appropriate depending on a material of layers to be etched.

Next, an insulating layer is formed so as to cover the semiconductor region 302, and the insulating layer in a region that overlaps with the semiconductor region 302 or in a region that is over the memory element 180 are selectively removed, so that the element isolation insulating layers 106 are formed (see FIG. 3B). The element isolation insulating layers 106 are formed using silicon oxide, silicon nitride, silicon oxynitride, or the like. As a method for removing the insulating layer, any of etching treatment and polishing treatment such as CMP can be employed. Note that the protective layer 300 is removed after formation of the semiconductor region 302 or after formation of the element isolation insulating layers 106.

Next, an insulating layer is formed over the semiconductor region 302, and a layer including a conductive material is formed over the insulating layer.

The insulating layer serves as a gate insulating layer 114 later, and the insulating layer preferably has a single-layer structure or a stacked structure using a film containing any of silicon oxide, silicon oxynitride, silicon nitride, hafnium oxide, aluminum oxide, tantalum oxide, yttrium oxide, hafnium silicate ($HfSi_xO_y$ (x>0, y>0)), hafnium silicate ($Hf\text{-}Si_xO_y$ (x>0, y>0)) to which nitrogen is added, hafnium aluminate ($HfAl_xO_y$ (x>0, y>0)) to which nitrogen is added, and the like formed by a plasma CVD method, a sputtering method, or the like. Alternatively, the surface of the semiconductor region 302 is oxidized or nitrided by high-density plasma treatment or thermal oxidation treatment, whereby the insulating layer may be formed. The high-density plasma treatment can be performed using, for example, a mixed gas of a rare gas such as He, Ar, Kr, or Xe and a gas such as oxygen, nitrogen oxide, ammonia, nitrogen, or hydrogen. The insulating layer can have a thickness of, for example, greater than or equal to 1 nm and less than or equal to 100 nm, preferably greater than or equal to 10 nm and less than or equal to 50 nm.

The layer including a conductive material can be formed using a metal material such as aluminum, copper, titanium, tantalum, and tungsten. The layer including a conductive material may be formed using a semiconductor material such as polycrystalline silicon. There is no particular limitation on the method for forming the layer including a conductive material, and any of a variety of film formation methods such as an evaporation method, a plasma CVD method, a sputtering method, and a spin coating method can be employed. Note that this embodiment shows an example of the case where the layer including a conductive material is formed using a metal material.

After that, the insulating layer and the layer including a conductive material are partly etched, so that the gate insulating layer 114 and the gate electrode 118 are formed (see FIG. 3C).

Next, an insulating layer 304 is formed to cover the gate insulating layer 114. Phosphorus (P), arsenic (As), or the like is then added to the semiconductor region 302, so that the impurity regions 110 with a shallow junction depth are formed. Note that phosphorus or arsenic is added here in order to form an n-channel transistor; impurity elements such as boron (B) or aluminum (Al) may be added in the case of forming a p-channel transistor. The channel formation region 108 is formed in the semiconductor region 302 below the gate insulating layer 114 by the formation of the impurity regions 110 (see FIG. 3C). Here, although the concentration of the impurities added can be set as appropriate, the concentration is preferably increased when the size of a semiconductor element is extremely decreased. Further, a process in which the insulating layer 304 is formed after formation of the impurity regions 110 may be employed instead of the process employed here in which the impurity regions 110 are formed after formation of the insulating layer 304.

Next, the sidewall insulating layers 116 are formed (see FIG. 3D). An insulating layer is formed so as to cover the insulating layer 304 and then subjected to highly anisotropic etching treatment, whereby the sidewall insulating layers 116 can be formed in a self-aligned manner. At this time, it is preferable to partly etch the insulating layer 304 so that a top surface of the gate electrode 118 and top surfaces of the impurity regions 110 are exposed. Note that the sidewall insulating layers 116 may be omitted in some cases for the purpose of high integration or the like.

Next, an insulating layer is formed so as to cover the gate electrode 118, the impurity regions 110, the side wall insulating layers 116, and the like. Phosphorus (P), arsenic (As), or the like is then added to regions which are in contact with the impurity regions 110, whereby the high-concentration impurity regions 111 are formed. After that, the insulating layer is removed, and a metal layer 306 is formed so as to cover the gate electrode 118, the side wall insulating layers 116, the high-concentration impurity regions 111, and the like (see FIG. 4A). A variety of film formation methods such as a vacuum evaporation method, a sputtering method, or a spin coating method can be employed for forming the metal layer 306. The metal layer 306 is preferably formed using a metal material that reacts with a semiconductor material contained in the semiconductor region 302 to be a low-resistance metal compound. Examples of such metal materials include titanium, tantalum, tungsten, nickel, cobalt, and platinum.

Next, heat treatment is performed so that the metal layer 306 reacts with the semiconductor material. Thus, the metal compound regions 112 that are in contact with the high-concentration impurity regions 111 are formed (see FIG. 4B). Note that when the gate electrode 118 is formed using polycrystalline silicon or the like, a metal compound region is also formed in a region in contact with the gate electrode 118 and the metal layer 306.

As the heat treatment, heat treatment by irradiation with a flash lamp can be employed, for example. Although it is needless to say that another heat treatment method may be used, a method by which heat treatment for an extremely short time can be obtained is preferably used in order to improve the controllability of chemical reaction in formation of the metal compound. Note that the metal compound regions are formed by reaction of the metal material and the semiconductor material and have sufficiently high conductivity. The formation of the metal compound regions can sufficiently reduce the electric resistance and improve element characteristics. Note that the metal layer 306 is removed after the metal compound regions 112 are formed.

Next, the first insulating layer 120 and the second insulating layer 122 are formed so as to cover the components formed in the above steps (see FIG. 4C). The first insulating layer 120 and the second insulating layer 122 can be formed using a material including an inorganic insulating material such as silicon oxide, silicon oxynitride, silicon nitride, hafnium oxide, aluminum oxide, or tantalum oxide. Moreover, the first insulating layer 120 and the second insulating layer 122 can be formed using an organic insulating material such as polyimide or acrylic. Note that although a stacked structure of the first insulating layer 120 and the second insulating layer 122 is employed here, one embodiment of the disclosed invention is not limited to this. A single-layer structure or a stacked structure including three or more layers may be used.

After that, openings which reach the metal compound regions 112 are formed in the first insulating layer 120 and the second insulating layer 122, and the source and drain electrodes 124 are formed in the openings (see FIG. 4D). The source and drain electrodes 124 can be formed in such a manner, for example, that a conductive layer is formed in a region including the openings by a plasma CVD method, a sputtering method, or the like and then the conductive layer is partly removed by etching or the like.

Specifically, for example, the source and drain electrodes 124 can be formed in such a manner that a titanium film is formed to have a small thickness by a sputtering method in a region including the openings and a titanium nitride film is then formed to have a small thickness by a plasma CVD method, and then, a tungsten film is formed so as to be embedded in the openings. Here, the titanium film formed by a sputtering method has a function of reducing a surface of an oxide film (e.g., a natural oxide film), over which the titanium film is formed, to decrease the contact resistance with the lower electrodes or the like (here, the metal compound regions 112). The titanium nitride film formed after the formation of the titanium film has a barrier function of preventing diffusion of the conductive material. A copper film may be formed by a plating method after the formation of the barrier film of titanium, titanium nitride, or the like.

Note that only the source and drain electrodes 124 which are in contact with the metal compound regions 112 are shown here; however, an electrode that is in contact with the gate electrode 118, and the like can also be formed in this step. There is no particular limitation on a material for forming the source and drain electrodes 124, and a variety of conductive materials can be used. For example, a conductive material such as molybdenum, titanium, chromium, tantalum, tungsten, aluminum, copper, neodymium, or scandium can be used. In view of heat treatment performed later, the source and drain electrodes 124 are preferably formed using a material having heat resistance high enough to withstand the heat treatment.

Accordingly, the transistor 150 including the substrate 100 is formed over the BOX layer 104 which is formed over the supporting substrate 102 (see FIG. 4D). The transistor 150 including the substrate 100 is formed using single crystal silicon which is used as an SOI substrate, and thus can be operated at high speed.

Note that an electrode, a wiring, an insulating layer, or the like may be further formed after the above step. When the wirings have a multi-layer structure of a stacked structure including an interlayer insulating layer and a conductive layer, a highly integrated semiconductor device can be provided.

<Manufacturing Method for Transistor in Memory Element>

Next, steps for manufacturing the transistor 160 over the supporting substrate 102 will be described with reference to FIGS. 5A to 5C.

First, the supporting substrate 102 including the transistor 150 formed over the BOX layer 104 shown in FIG. 4D is prepared. An unnecessary portion over the BOX layer 104 in the memory element 180 is removed, so that the BOX layer 104 is exposed. The removal can be performed in such a manner that a resist mask 308 is formed in the peripheral circuit 170, and a portion which is not covered with the resist mask 308 is removed by etching. As the etching method, dry etching, wet etching, or the like can be selected as appropriate.

Figures 5A, 5B, 5C:
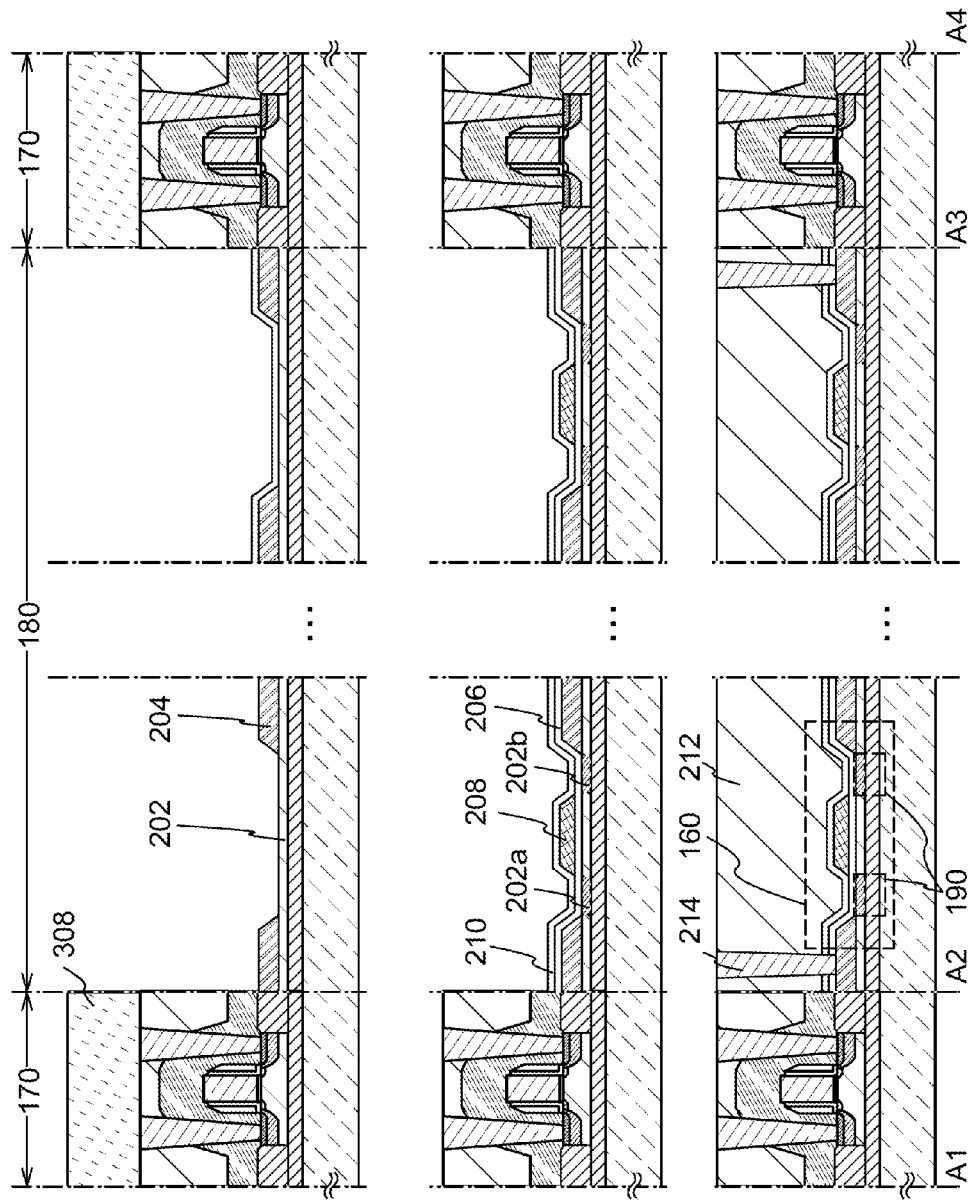
FIGS. 5A to 5C are cross-sectional views relating to manufacturing steps of a semiconductor device.

Next, the oxide semiconductor 202 is formed over the BOX layer 104 (see FIG. 5A).

The oxide semiconductor 202 can be formed using any of the following oxide semiconductors: a four-component metal oxide such as an In—Sn—Ga—Zn—O-based oxide semiconductor; three-component metal oxides such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor; two-component metal oxides such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, and an In—Mg—O-based oxide semiconductor; and single-component metal oxides such as an In—O-based oxide semiconductor, a Sn—O-based oxide semiconductor, and a Zn—O-based oxide semiconductor.

In particular, an In—Ga—Zn—O-based oxide semiconductor material has sufficiently high resistance when there is no electric field and thus off-state current can be sufficiently reduced. In addition, with high field-effect mobility, the In—Ga—Zn—O-based oxide semiconductor material is suitable for a semiconductor device.

As a typical example of the In—Ga—Zn—O-based oxide semiconductor material, one represented by InGaO$_3$(ZnO)$_m$ (m is larger than 0 and is not an integer) is given. Moreover, there is an oxide semiconductor material represented by InMO$_3$(ZnO)$_m$ (m is larger than 0 and is not an integer), using M instead of Ga. Here, M denotes one or more metal elements selected from gallium (Ga), aluminum (Al), iron (Fe), nickel (Ni), manganese (Mn), cobalt (Co), or the like. For example, M can be Ga, Ga and Al, Ga and Fe, Ga and Ni, Ga and Mn, Ga and Co, or the like. Note that the above-described compositions are derived from the crystal structures that the oxide semiconductor material can have and are only examples.

As a target for forming the oxide semiconductor 202 by a sputtering method, a target having a composition ratio of In:Ga:Zn=1:x:y [atomic ratio] (x is more than or equal to 0 and y is more than or equal to 0.5 and less than or equal to 5) is preferably used. For example, a target with a composition ratio of In:Ga:Zn=1:1:1 [atomic ratio] (x=1 and y=1; that is, In$_2$O$_3$:Ga$_2$O$_3$:ZnO=1:1:2 [molar ratio]) can be used. Further, a target with a composition ratio of In:Ga:Zn=1:1:0.5 [atomic ratio] (x=1 and y=0.5), a target with a composition ratio of In:Ga:Zn=1:1:2 [atomic ratio] (x=1 and y=2), or a target with a composition ratio of In:Ga:Zn=1:0:1 [atomic ratio] (x=0 and y=1) can be used.

In this embodiment, the oxide semiconductor 202 is formed by a sputtering method using an In—Ga—Zn—O-based metal oxide target.

It is preferable that a metal oxide contained in the metal oxide target have a relative density of higher than or equal to 80%, preferably higher than or equal to 95%, more preferably higher than or equal to 99.9%. With the use of the metal oxide target with high relative density, the oxide semiconductor 202 can be formed to have a dense structure.

An atmosphere for formation of the oxide semiconductor 202 is preferably a rare gas (typically argon) atmosphere, an oxygen atmosphere, or a mixed atmosphere of a rare gas (typically argon) and oxygen. Specifically, it is preferable to use a high-purity gas atmosphere, for example, from which impurities such as hydrogen, water, a hydroxyl group, or hydride are removed to a concentration of lower than or equal to 1 ppm (preferably lower than or equal to 10 ppb).

In the formation of the oxide semiconductor 202, for example, an object to be processed is held in a treatment chamber which is kept under reduced pressure and the object is heated so that the temperature of the object is higher than or equal to 100° C. and lower than 550° C., preferably higher than or equal to 200° C. and lower than or equal to 400° C. Alternatively, the temperature of the object in the formation of the oxide semiconductor 202 may be room temperature. Moisture in the process chamber is removed, a sputtering gas from which hydrogen, water, and the like are removed is introduced, and the above target is used, and thus the oxide semiconductor 202 is formed. By forming the oxide semiconductor 202 while heating the object, impurities in the oxide semiconductor 202 can be reduced. Moreover, damage due to sputtering can be reduced. In order to remove moisture in the treatment chamber, an entrapment vacuum pump is preferably used. For example, a cryopump, an ion pump, a titanium sublimation pump, or the like can be used. Alternatively, a turbo molecular pump provided with a cold trap may also be used. By evacuation with the use of a cryopump or the like, hydrogen, water, and the like can be removed from the treatment chamber; thus, the concentration of the impurities in the oxide semiconductor 202 can be reduced.

The oxide semiconductor 202 can be formed under the following conditions, for example: the distance between the object to be processed and the target is 170 mm, the pressure is 0.4 Pa, the direct current (DC) power is 0.5 kW, and the atmosphere is an oxygen (oxygen: 100%) atmosphere, an argon (argon: 100%) atmosphere, or a mixed atmosphere including oxygen and argon. Note that a pulsed direct current (DC) power source is preferably used because dust (e.g., powder substances generated in film formation) can be reduced and the film thickness can be made uniform. The thickness of the oxide semiconductor 202 is greater than or equal to 1 nm and less than or equal to 50 nm, preferably greater than or equal to 1 nm and less than or equal to 30 nm, more preferably greater than or equal to 1 nm and less than or equal to 10 nm. Using the oxide semiconductor 202 with such a thickness can suppress a short-channel effect due to miniaturization. Note that an appropriate thickness differs depending on an oxide semiconductor material used, the usage of a semiconductor device, or the like; therefore, it is also possible to set the thickness as appropriate depending on the material to be used, the usage, or the like.

Note that before the oxide semiconductor 202 is formed by a sputtering method, a substance attached to a surface in which the oxide semiconductor is to be formed (e.g., a surface of the BOX layer 104) is preferably removed by reverse sputtering in which an argon gas is introduced and plasma is generated. Here, the reverse sputtering is a method in which ions collide with a surface to be processed so that the surface is modified, in contrast to normal sputtering in which ions collide with a sputtering target. An example of a method for making ions collide with a surface to be processed is a method in which high-frequency voltage is applied to the surface to be processed in an argon atmosphere so that plasma is generated in the vicinity of the object to be processed. Note that an atmosphere of nitrogen, helium, oxygen, or the like may be used instead of an argon atmosphere.

After that, heat treatment (first heat treatment) is preferably performed on the oxide semiconductor 202. With the first heat treatment, excessive hydrogen (including water and a hydroxyl group) in the oxide semiconductor 202 can be removed, the structure of the oxide semiconductor can be improved, and defect levels in an energy gap can be reduced. The temperature of the first heat treatment is, for example, higher than or equal to 300° C. and lower than 550° C., or higher than or equal to 400° C. and lower than or equal to 500° C.

The heat treatment can be performed in such a manner that, for example, an object to be heated is introduced into an electric furnace in which a resistance heating element or the like is used and heated, under a nitrogen atmosphere at 450° C. for an hour. During the heat treatment, the oxide semiconductor 202 is not exposed to the air to prevent the entry of water and hydrogen.

The heat treatment apparatus is not limited to the electric furnace and may be an apparatus for heating an object to be processed by thermal radiation or thermal conduction from a medium such as a heated gas. For example, a rapid thermal anneal (RTA) apparatus such as a gas rapid thermal anneal (GRTA) apparatus or an lamp rapid thermal anneal (LRTA) apparatus can be used. An LRTA apparatus is an apparatus for heating an object to be processed by radiation of light (electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment such as nitrogen or a rare gas such as argon is used.

For example, as the first heat treatment, a GRTA process may be performed as follows. The object to be processed is put in an inert gas atmosphere that has been heated, heated for several minutes, and taken out from the inert gas atmosphere. The GRTA process enables high-temperature heat treatment for a short time. Moreover, the GRTA process can be employed even when the temperature exceeds the upper temperature limit of the object to be processed. Note that the inert gas may be switched to a gas including oxygen during the process. This is because defect level in energy gap due to oxygen deficiency can be reduced by performing the first heat treatment in an atmosphere including oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is higher than or equal to 6 N (99.9999%), preferably higher than or equal to 7 N (99.99999%) (that is, the concentration of the impurities is lower than or equal to 1 ppm, preferably lower than or equal to 0.1 ppm).

In any case, impurities are reduced by the first heat treatment so that the oxide semiconductor 202 which is an i-type (intrinsic) or substantially i-type oxide semiconductor is obtained. Consequently, a transistor having extremely favorable characteristics can be obtained.

The above heat treatment (first heat treatment) can be referred to as dehydration treatment, dehydrogenation treatment, or the like because of its effect of removing hydrogen, water, and the like. The dehydration treatment or the dehydrogenation treatment can be performed after the oxide semiconductor is formed, after the gate insulating layer is formed, after a gate electrode layer is formed, or the like. Such dehydration treatment or dehydrogenation treatment may be conducted once or plural times.

Next, a conductive layer is formed over the oxide semiconductor 202 and is selectively etched to form the source and drain electrodes 204 (see FIG. 5A).

The conductive layer can be formed by a PVD method such as a sputtering method or a CVD method such as a plasma CVD method. As a material for the conductive layer, an element selected from aluminum, chromium, copper, tantalum, titanium, molybdenum, and tungsten; an alloy containing any of these elements as a component; or the like can be used. Moreover, one or more materials selected from manganese, magnesium, zirconium, and beryllium may be used. Alternatively, aluminum combined with one or more of elements selected from titanium, tantalum, tungsten, molybdenum, chromium, neodymium, and scandium may be used.

The conductive layer may have a single-layer structure or a stacked structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked. Note that the conductive layer having a single-layer structure of a titanium film or a titanium nitride film has an advantage in that it can be easily processed into the source and drain electrodes 204 having tapered shapes.

Alternatively, the conductive layer may be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

The conductive layer is preferably etched so that end portions of the source and drain electrodes 204 which are to be formed are tapered. Here, a taper angle is, for example, preferably greater than or equal to 30° and less than or equal to 60°. The source and drain electrodes 204 are etched to have tapered end portions, so that the coverage with the gate insulating layer 206 to be formed later can be improved and a break thereof due to a step can be prevented.

Next, the gate insulating layer 206 is formed over the oxide semiconductor 202 and the source and drain electrodes 204 (see FIG. 5B). The gate insulating layer 206 can be formed by a plasma CVD method, a sputtering method, or the like. The gate insulating layer 206 is preferably formed so as to contain silicon oxide, silicon nitride, silicon oxynitride, aluminum oxide, tantalum oxide, hafnium oxide, yttrium oxide, hafnium silicate ($HfSi_xO_y$ (x>0, y>0)), hafnium silicate (Hf-$Si_xO_y$ (x>0, y>0)) to which nitrogen is added, hafnium aluminate ($HfAl_xO_y$ (x>0, y>0)) to which nitrogen is added, or the like. The gate insulating layer 206 may have a single-layer structure or a stacked structure. There is no particular limitation on the thickness; however, in the case where a semiconductor device is miniaturized, the thickness is preferably small for ensuring operation of the transistor. For example, in the case where silicon oxide is used, the thickness can be set to greater than or equal to 1 nm and less than or equal to 100 nm, preferably greater than or equal to 10 nm and less than or equal to 50 nm.

When a gate insulating layer 206 is thin as described above, gate leakage due to a tunneling effect or the like becomes a problem. In order to solve the problem of gate leakage, the gate insulating layer 206 may be formed using a high dielectric constant (high-k) material such as hafnium oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, or hafnium aluminate ($HfAl_xO_y$ (x>0, y>0)) to which nitrogen is added. By using a high-k material for the gate insulating layer 146, electrical characteristics can be ensured and the thickness can be large to prevent gate leakage. Note that a stacked structure of a film containing a high-k material and a film containing any one of silicon oxide, silicon nitride, silicon oxynitride, silicon nitride oxide, aluminum oxide, and the like may be employed.

After formation of the gate insulating layer 206, second heat treatment is preferably performed in an inert gas atmosphere or an oxygen atmosphere. The heat treatment may be performed at a temperature of higher than or equal to 200° C. and lower than or equal to 450° C., preferably higher than or equal to 250° C. and lower than or equal to 350° C. For example, the heat treatment may be performed at 250° C. for one hour in a nitrogen atmosphere. With the second heat treatment, variation in electric characteristics of the transistor can be reduced. In the case where the gate insulating layer 206 contains oxygen, oxygen can be supplied to the oxide semiconductor 202 and oxygen vacancies in the oxide semiconductor 202 can be filled; thus, an i-type (intrinsic) or substantially i-type oxide semiconductor can also be formed.

Note that the second heat treatment is performed after the gate insulating layer 206 is formed in this embodiment; however, the timing of the second heat treatment is not particularly limited to this. For example, the second heat treatment may be performed after the gate electrode is formed. Alternatively, the second heat treatment may be performed following the first heat treatment, the first heat treatment may double as the second heat treatment, or the second heat treatment may double as the first heat treatment.

Next, the gate electrode 208 is formed over the gate insulating layer 206 and in a region between the source and drain electrodes 204 (see FIG. 5B). The gate electrode 208 can be formed in such a manner that a conductive layer is formed over the gate insulating layer 206 and then etched selectively. The conductive layer to be the gate electrode 208 can be formed by a PVD method such as a sputtering method or a CVD method such as a plasma CVD method. The details are similar to those of the source and drain electrodes 204 or the like; thus, description thereof can be referred to.

Next, the impurity regions 202a and 202b are formed in the oxide semiconductor 202 (see FIG. 5B).

Impurities are implanted through the gate insulating layer 206 using the source and drain electrodes 204 and the gate electrode 208 as a mask, whereby the impurity regions 202a and 202b can be formed in a self-aligned manner.

As the impurity, nitrogen (N), phosphorus (P), arsenic (As), and antimony (Sb) which belong to Group V (Group 15) or the like can be given. In this embodiment, an example in which nitrogen is implanted will be described.

As an impurity implantation method, an ion implantation method, an ion doping method, or the like can be used. In an ion implantation method, a source gas is made into plasma, ion species included in this plasma are extracted and mass-separated, ion species with predetermined mass are accelerated, and an object to be processed is irradiated with the accelerated ion species as an ion beam. In an ion doping method, a source gas is made into plasma, ion species are extracted from this plasma by an operation of a predetermined electric field, the extracted ion species are accelerated without mass separation, and an object to be processed is irradiated with the accelerated ion species in the form of an ion beam. When the implantation of nitrogen is performed using an ion implantation method involving mass-separation, elements other than desired impurities (here, nitrogen), for example, a metal element, can be prevented from being added into the oxide semiconductor 202. In addition, an ion doping method enables ion-beam irradiation to a larger area than an ion implantation method;

therefore, when the addition of impurities is performed by an ion doping method, the takt time can be shortened.

The concentration of nitrogen in the impurity regions 202a and 202b is preferably higher than $5 \times 10^{19}$ atoms/cm$^3$. The concentration of nitrogen in the impurity regions 202a and 202b is measured by secondary ion mass spectrometry (SIMS).

Further, when the concentration of nitrogen in the impurity regions 202a and 202b is higher than or equal to $1 \times 10^{20}$ atoms/cm$^3$ and lower than 7 atoms %, the crystal structure of the impurity regions 202a and 202b may be a wurtzite type structure by performing heat treatment after formation of the impurity regions 202a and 202b. The heat treatment may be performed at a temperature of higher than or equal to 300° C. and lower than or equal to 600° C., preferably higher than or equal to 350° C. and lower than or equal to 500° C.

Further, as described in this embodiment, by the impurity implantation treatment through the gate insulating layer 206, excessive damage to the oxide semiconductor 202 can be reduced.

Note that in this embodiment, an example in which the impurity implantation treatment is performed through the gate insulating layer 206 after formation of the gate electrode 208 is described; however, one embodiment of the present invention is not limited to this. The impurity implantation treatment may be performed through the gate insulating layer 206 and the third insulating layer 210 after formation of the third insulating layer 210.

Accordingly, in an oxide semiconductor, impurity regions are provided so as to sandwich a channel formation region, so that the energy gap of the impurity regions is smaller than the energy gap of the channel formation region; thus, carriers easily flow therein. Therefore, data can be written at high speed by using a transistor having such a structure.

Further, impurity regions are provided so as to sandwich a channel formation region, so that a transistor having a structure in which the concentration of an electric field applied to an end portion of a drain is relieved.

The resistance of the oxide semiconductor 202 is lowered by implanting impurities; therefore, the impurity regions 202a and 202b can also be referred to as low-resistance regions (also referred to as n-type regions). Accordingly, the BOX layer 104 over the supporting substrate 102 serves as a dielectric, and the capacitor 190 includes the supporting substrate 102, the BOX layer 104, and the low-resistance regions (impurity regions 202a and 202b) (see FIG. 5C).

Next, the third insulating layer 210 is formed over the gate insulating layer 206 and the gate electrode 208 (see FIG. 5B). The third insulating layer 210 can be formed by a sputtering method, a plasma CVD method, or the like. The third insulating layer 210 can be formed using a material including an inorganic insulating material such as silicon oxide, silicon oxynitride, silicon nitride, hafnium oxide, aluminum oxide, or tantalum oxide. Note that in this embodiment, the third insulating layer 210 has a single layer structure; however, one embodiment of the disclosed invention is not limited to this. The third insulating layer 210 may have a stacked structure including two or more layers. A structure in which the third insulating layer 210 is not provided can be employed.

Next, the fourth insulating layer 212 is formed over the third insulating layer 210 (see FIG. 5C). The fourth insulating layer 212 can be formed using an organic insulating material such as polyimide or acrylic. Note that the fourth insulating layer 212 is preferably formed so as to have a flat surface. This is because when the fourth insulating layer 212 is formed to have a flat surface, an electrode, a wiring, or the like can be favorably formed over the fourth insulating layer 212 even in the case where the semiconductor device or the like is miniaturized.

Next, openings which reach the source and drain electrodes 204 are formed in the fourth insulating layer 212, the third insulating layer 210, and the gate insulating layer 206, and the electrode 214 is formed in the openings (see FIG. 5C). The electrode 214 can be formed in such a manner, for example, that a conductive layer is formed in regions including the opening by a plasma CVD method, a sputtering method, or the like and then part of the conductive layer is removed by etching, CMP, or the like. Further, when the conductive layer to be the electrode 214 is removed, planarization of the upper portion of the transistor 150 included in the peripheral circuit 170 is preferably performed at the same time.

Accordingly, the transistor 160 formed using the oxide semiconductor 202 is formed over the BOX layer 104 formed over the supporting substrate 102 (see FIG. 5C). Note that the transistor 160 has a top-gate top-contact (TGTC) structure.

In this embodiment, the method for forming the low-resistance regions (impurity regions 202a and 202b) in an oxide semiconductor is described as an example. As one of the methods for forming impurity regions which function as source and drain regions in a transistor formed using an oxide semiconductor by a self-aligned process, a method in which a surface of an oxide semiconductor film is exposed and argon plasma treatment is performed to reduce the resistance of the region in the oxide semiconductor film, which is exposed to plasma is disclosed (S. Jeon et al. "180 nm Gate Length Amorphous InGaZnO Thin Film Transistor for High Density Image Sensor Application", *IEDM Tech. Dig.*, p. 504, 2010).

However, in the manufacturing method, a gate insulating film needs to be partly removed after formation of the gate insulating film so that portions which are to serve as the source and drain regions are exposed. At the time of removing the gate insulating film, an oxide semiconductor film below the gate insulating film is partly over-etched, so that the thicknesses of the portions which are to serve as the source and drain regions are reduced. As a result, the resistance of the source and drain regions is increased, and defects of the transistor characteristics due to the over etching is likely to occur.

To miniaturize a transistor, it is necessary to employ a dry etching method with high process precision. However, the above over etching is more likely to occur when a dry etching method which does not sufficiently ensure selectivity between the oxide semiconductor film and the gate insulating film is used.

For example, over etching does not cause any problem when the oxide semiconductor film has a sufficient thickness, but in the case where the channel length is shorter than or equal to 200 nm, it is necessary that a portion of the oxide semiconductor film, which is to serve as a channel formation region, be shorter than or equal to 20 nm, preferably shorter than or equal to 10 nm, in order to prevent a short-channel effect. When such a thin oxide semiconductor film is used, the over etching of the oxide semiconductor film is not preferable because the over etching causes an increase in the resistance of the source region and the drain region, and defects of the transistor characteristics, as described above.

However, when impurities are implanted into the oxide semiconductor in the state where the oxide semiconductor film is not exposed and a gate insulating film remains, as described in this embodiment, the over etching of the oxide semiconductor film can be prevented and excessive damage to the oxide semiconductor film can be reduced. Consequently, the characteristics and reliability of the transistor can be improved.

<Connection Method of Peripheral Circuit and Memory Element>

Figure 6:
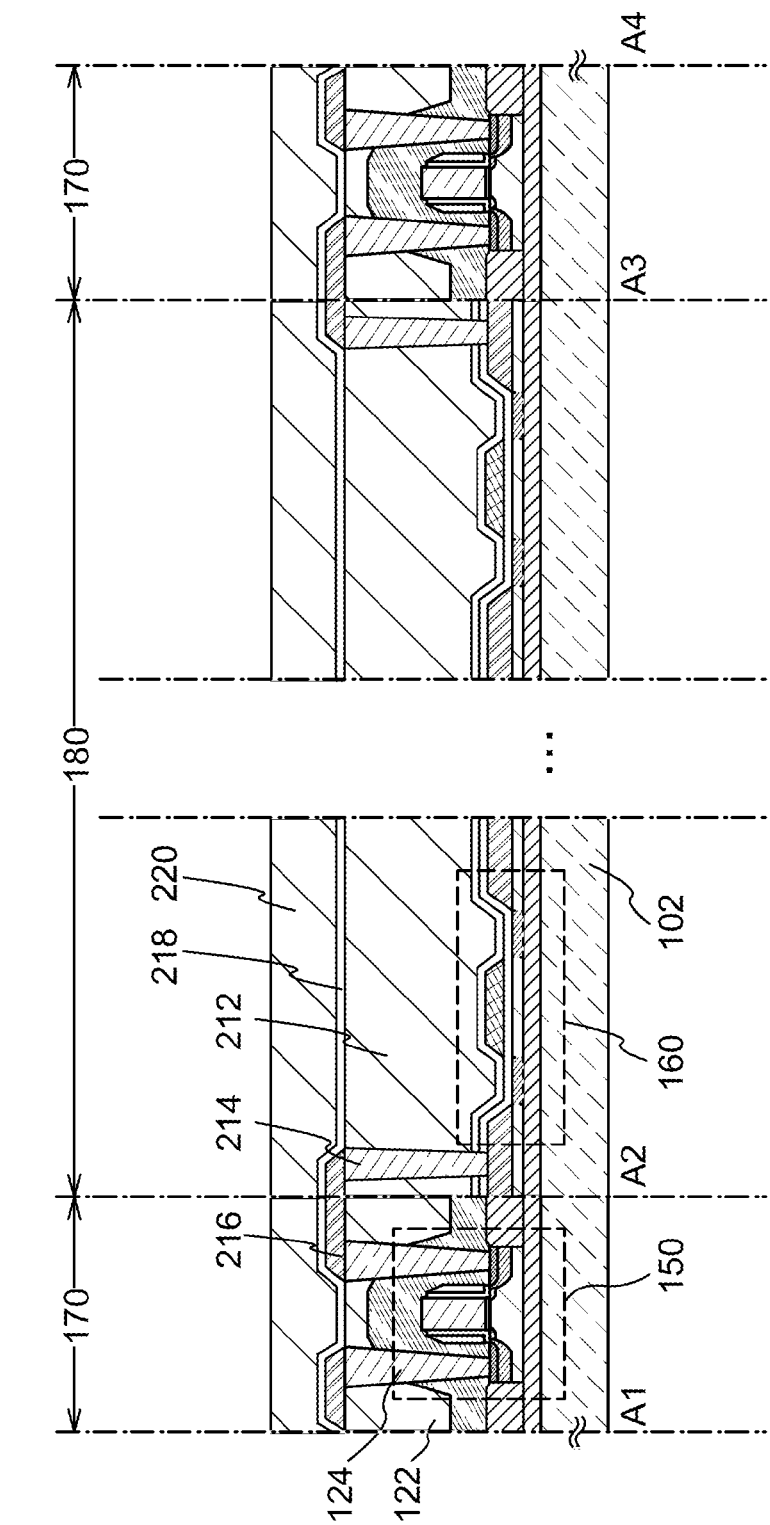
FIG. 6 is a cross-sectional view relating to manufacturing steps of a semiconductor device.

Next, a connection method of the peripheral circuit 170 and the memory element 180 will be described with reference to FIG. 6.

First, the supporting substrate 102 shown in FIG. 5C, over which the transistor 150 formed using single crystal silicon which is used as an SOI substrate and the transistor 160 formed using an oxide semiconductor are formed is prepared.

Next, a conductive layer is formed over the second insulating layer 122, the source and drain electrodes 124, the fourth insulating layer 212, and the electrode 214, and an unnecessary portion of the conductive layer is removed, so that the connecting electrodes 216 are formed. The connecting electrodes 216 can be formed in such a manner, for example, that a conductive layer is formed by a sputtering method or the like, and then etching treatment is performed thereon.

As a material of the electrode 214, an element selected from aluminum, chromium, copper, tantalum, titanium, molybdenum, and tungsten; an alloy containing any of these elements as a component; or the like can be used. Moreover, one or more materials selected from manganese, magnesium, zirconium, and beryllium may be used. Alternatively, aluminum combined with one or more of elements selected from titanium, tantalum, tungsten, molybdenum, chromium, neodymium, and scandium may be used.

Next, the fifth insulating layer 218 and the sixth insulating layer 220 are formed over the second insulating layer 122, the fourth insulating layer 212, and the connecting electrodes 216.

The fifth insulating layer 218 and the sixth insulating layer 220 can be formed using a material including an inorganic insulating material such as silicon oxide, silicon oxynitride, silicon nitride, hafnium oxide, aluminum oxide, or tantalum oxide. Moreover, the fifth insulating layer 218 and the sixth insulating layer 220 can be formed using an organic insulating material such as polyimide or acrylic.

In this embodiment, a structure in which the fifth insulating layer 218 and the sixth insulating layer 220 are stacked is described as an example; however, one embodiment of the present invention is not limited to this. A single-layer structure or a stacked structure including three or more layers may be used.

Through the above steps, the transistor 150 formed using single crystal silicon which is used as an SOI substrate in the peripheral circuit 170 and the transistor 160 formed using an oxide semiconductor in the memory element 180 can be formed over the BOX layer 104 which is formed over the supporting substrate 102.

Since the off-state current of the transistor 160 formed using an oxide semiconductor is extremely low, stored data can be held for an extremely long time by using the transistor as a memory element. That is, power consumption can be sufficiently reduced because refresh operation becomes unnecessary or the frequency of refresh operation can be extremely low. Accordingly, stored data can be held for a long time even when power is not supplied.

Further, by using single crystal silicon which is used as an SOI substrate and utilizing features of a thin single crystal silicon layer formed over an insulating layer, a semiconductor integrated circuit with high added values such as high integration, high-speed driving, and low power consumption can be obtained.

A capacitor can be formed using a supporting substrate, an insulating layer provided over the supporting substrate, and a transistor formed using an oxide semiconductor over the insulating layer. Therefore, it is not required to form a capacitor in the plane direction, so that the circuit size can be reduced.

The methods and structures described in this embodiment can be combined as appropriate with any of the methods and structures described in the other embodiments.

(Embodiment 3)

In this embodiment, a structure and a manufacturing method which are different from those of a transistor formed using an oxide semiconductor and formed in a memory element described in Embodiment 1 and Embodiment 2 will be described with reference to FIGS. 7A to 7C. Part of a structure of the transistor according to this embodiment is in common with the structure of the transistor 160 according to any of the above embodiments. Therefore, a difference will be mainly described below.

Although the transistor 160 described in Embodiment 1 and Embodiment 2 having a top-gate top-contact (TGTC) structure is illustrated, a bottom-gate top-contact (BGTC) structure will be illustrated in this embodiment. The top-gate top-contact transistor differs greatly from the bottom-gate top-contact transistor in the manufacturing method of an oxide semiconductor.

First, the transistor 150 formed over the BOX layer 104 which is over the supporting substrate 102 shown in FIG. 4D is prepared, and an unnecessary portion over the BOX layer 104 in the memory element 180 is removed, so that the BOX layer 104 is exposed. The removal can be performed in such a manner that a resist mask 308 is formed over the peripheral circuit 170, and the exposed portion of the resist mask 308 is removed by etching. As the etching method, dry etching, wet etching, or the like can be selected as appropriate. Further, after the BOX layer 104 is exposed, the unnecessary resist mask 308 is removed.

Figure 7:
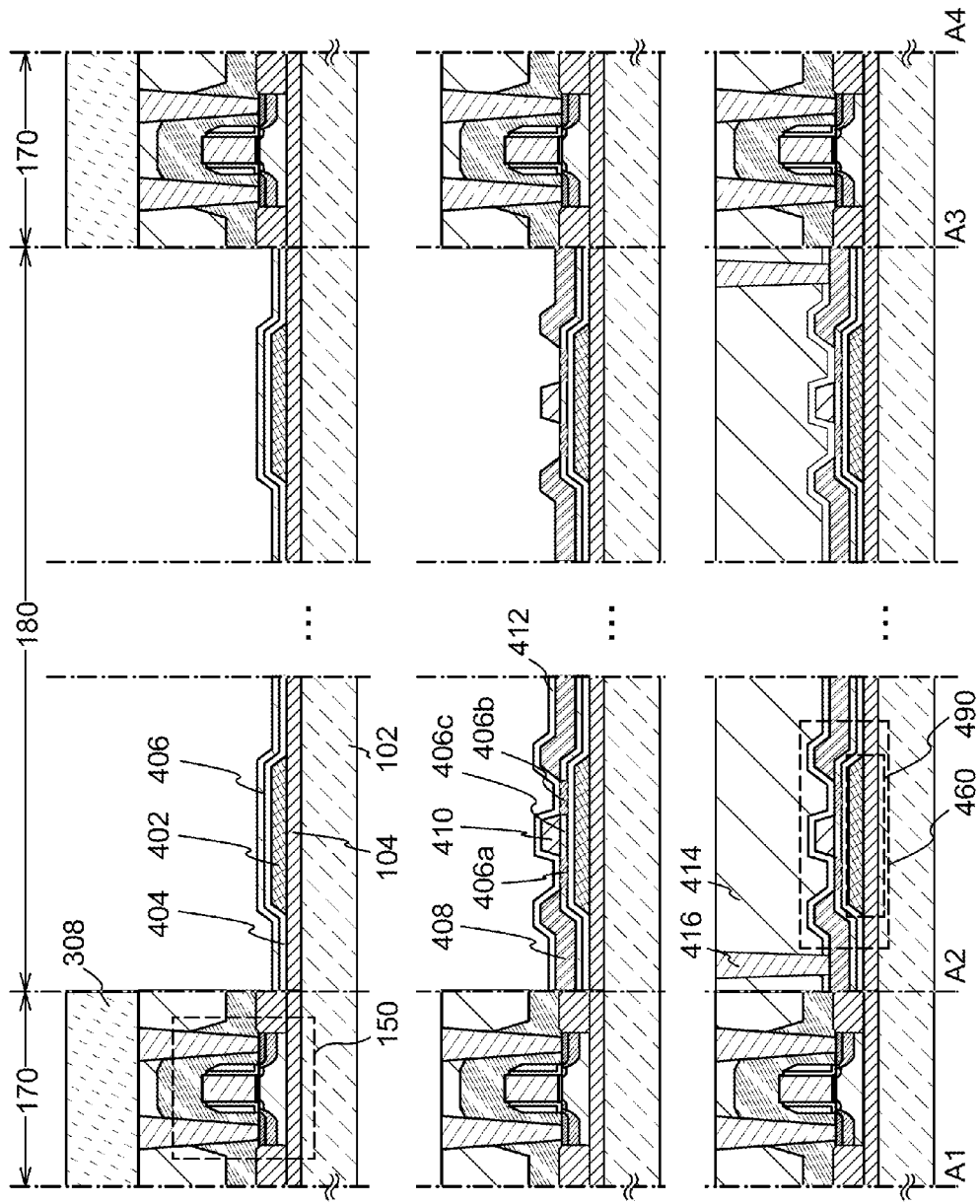
FIGS. 7A to 7C are cross-sectional views relating to manufacturing steps of a semiconductor device.

Next, a gate electrode 402 is formed over the BOX layer 104 (see FIG. 7A). The gate electrode 402 can be formed in such a manner that a conductive layer is formed over the BOX layer 104 and then etched selectively. The material and the manufacturing method which can be used for the gate electrode 402 are similar to those of the gate electrode 208 described in Embodiment 2; thus, description thereof can be referred to.

Next, a gate insulating layer 404 is formed over the gate electrode 402 and the BOX layer 104 (see FIG. 7A). The material and the manufacturing method which can be used for the gate insulating layer 404 are similar to those of the gate insulating layer 206 described in Embodiment 2; thus, description thereof can be referred to.

Next, an oxide semiconductor 406 is formed over the gate insulating layer 404 (see FIG. 7A).

The oxide semiconductor 406 in this embodiment is in a single crystal state, a polycrystalline (also referred to as polycrystal) state, an amorphous state, or the like. The oxide semiconductor 406 is preferably a CAAC-OS (c-axis aligned crystalline oxide semiconductor) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

Further, the oxide semiconductor 406 is formed by a sputtering method, a molecular beam epitaxy method, an atomic layer deposition method, or a pulsed laser deposition method. Note that a substrate is heated in formation of the oxide semiconductor 406, so that the oxide film in which the proportion of the crystal parts to the amorphous parts is high can be formed. For example, the substrate temperature is higher than or equal to 150° C. and lower than or equal to 450° C., preferably higher than or equal to 200° C. and lower than or equal to 350° C.

Crystallization of the oxide semiconductor which is the CAAC-OS film can be further promoted by increasing the substrate temperature.

Next, first heat treatment may be performed on the oxide semiconductor 406. With the first heat treatment, the proportion of the crystal parts to the amorphous parts in the oxide semiconductor 406 can be further increased. The first heat treatment is preferably performed at a temperature higher than or equal to 200° C. and lower than the strain point of the substrate, more preferably higher than or equal to 250° C. and lower than or equal to 450° C. Although the atmosphere is not limited, the heat treatment is performed in an oxidizing atmosphere, an inert atmosphere, or a reduced-pressure atmosphere. The treatment time is 3 minutes to 24 hours. As the treatment time is increased, the proportion of the crystal parts to the amorphous parts in the oxide semiconductor film can be increased. However, heat treatment for longer than 24 hours is not preferable because the productivity is reduced.

The oxidizing atmosphere is an atmosphere containing an oxidizing gas. Note that the oxidizing gas is oxygen, ozone, nitrogen dioxide, or the like, and it is preferable that the oxidizing gas does not contain water, hydrogen, and the like. For example, the purity of oxygen, ozone, or nitrogen dioxide introduced into a heat treatment apparatus is set to higher than or equal to 6N (99.9999%), preferably higher than or equal to 7N (99.99999%) (that is, the concentration of the impurities is lower than or equal to 1 ppm, preferably lower than 0.1 ppm). As the oxidizing atmosphere, an oxidizing gas and an inert gas may be mixed to be used. In that case, the mixture contains an oxidizing gas at a concentration of higher than or equal to 10 ppm.

Here, an inert atmosphere is an atmosphere containing an inert gas such as nitrogen or a rare gas (e.g., helium, neon, argon, krypton, or xenon) as the main component. Specifically, the concentration of a reactive gas such as an oxidizing gas is lower than 10 ppm.

A rapid thermal anneal (RTA) apparatus can be used for the first heat treatment. With the use of the RTA apparatus, only in a short time, the heat treatment can be performed at a temperature higher than or equal to the strain point of the substrate. Thus, the time taken to form the oxide film in which the proportion of the crystal parts to the amorphous parts in the oxide semiconductor film is high can be shortened.

Further, a material represented by $InMO_3(ZnO)_m$ (m is larger than 0 and is not an integer) may be used as the oxide semiconductor 406. Here, M represents one or more metal elements selected from Ga, Al, Mn, and Co. For example, M may be Ga, Ga and Al, Ga and Mn, Ga and Co, or the like.

Next, a second oxide semiconductor (not shown) may be formed over the first oxide semiconductor 406, so that a stack of oxide semiconductors is formed. The first oxide semiconductor 406 and the second oxide semiconductor can be formed by a similar method.

When the substrate is heated while the second oxide semiconductor is formed, the second oxide semiconductor can be crystallized with the use of the first oxide semiconductor 406 as a seed crystal. At this time, to compose the first oxide semiconductor 406 and the second oxide semiconductor with the use of the same kind of element is referred to as "homo-growth". Alternatively, to compose the first oxide semiconductor 406 and the second oxide semiconductor with the use of elements, at least one kind of which differs between the first oxide film and the second oxide film, is referred to as "hetero-growth".

Note that second heat treatment may be performed after the second oxide semiconductor is formed. The second heat treatment may be performed in a manner similar to that of the first heat treatment. With the second heat treatment, a stack of oxide semiconductors in which the proportion of the crystal parts to the amorphous parts is high can be obtained. Further, with the second heat treatment, the second oxide semiconductor can be crystallized with the use of the first oxide semiconductor 406 as a seed crystal. At this time, homo-growth in which the first oxide semiconductor 406 and the second oxide semiconductor are composed of the same element may be caused. Alternatively, hetero-growth in which the first oxide semiconductor 406 and the second oxide semiconductor are composed of elements, at least one kind of which differs between the first oxide semiconductor 406 and the second oxide semiconductor, may be caused.

Accordingly, the oxide semiconductor 406 which is the CAAC-OS film can be formed. Further, an oxide semiconductor which is the CAAC-OS film can be used for the oxide semiconductor 202 in the transistor 160 described in any of the above embodiments.

Next, source and drain electrodes 408 are formed over the oxide semiconductor 406 (see FIG. 7B). The material and the manufacturing method which can be used for the source and drain electrodes 408 are similar to those of the source and drain electrodes 204 described in Embodiment 2; thus, description thereof can be referred to.

Next, an insulating film is formed over the oxide semiconductor 406 and the source and drain electrodes 408, and an unnecessary portion of the insulating film is removed, so that a protective insulating layer 410 (also referred to as a channel protective layer and a channel protective film) is formed between the source and drain electrodes 408. The protective insulating layer 410 can be formed by a sputtering method, a plasma CVD method, or the like. The protective insulating layer 410 can be formed using a material including an inorganic insulating material such as silicon oxide, silicon oxynitride, silicon nitride, hafnium oxide, aluminum oxide, or tantalum oxide.

Next, a third insulating layer 412 is formed over the oxide semiconductor 406, the source and drain electrodes 408, and the protective insulating layer 410 (see FIG. 7B). The material and the manufacturing method which can be used for the third insulating layer 412 are similar to those of the third insulating layer 210 described in Embodiment 2; thus, description thereof can be referred to.

Next, an impurity region 406a and an impurity region 406b are formed in the oxide semiconductor 406 (see FIG. 7B).

Impurities are implanted through the third insulating layer 412 using the source and drain electrodes 408 and the protective insulating layer 410 as a mask, whereby the impurity regions 406a and 406b can be formed in a self-aligned manner.

Part of the oxide semiconductor 406 which is located below the protective insulating layer 410 serves as a channel formation region 406c because impurities are not implanted into the part.

As the impurity, nitrogen (N), phosphorus (P), arsenic (As), and antimony (Sb) which belong to Group V (Group 15) or the like can be given. In this embodiment, an example in which nitrogen is implanted will be described.

As an impurity implantation method, an ion implantation method, an ion doping method, or the like can be used. In an ion implantation method, a source gas is made into plasma, ion species included in this plasma are extracted and mass-separated, ion species with predetermined mass are accelerated, and an object to be processed is irradiated with the accelerated ion species as an ion beam. In an ion doping method, a source gas is made into plasma, ion species are extracted from this plasma by an operation of a predetermined electric field, the extracted ion species are accelerated without mass separation, and an object to be processed is irradiated with the accelerated ion species in the form of an ion beam. When the implantation of nitrogen is performed using an ion implantation method involving mass-separation, elements other than desired impurities (here, nitrogen), for example, a metal element, can be prevented from being added into the oxide semiconductor 406. In addition, an ion doping method enables ion-beam irradiation to a larger area than an ion implantation method; therefore, when the addition of impurities is performed using an ion doping method, the takt time can be shortened.

The concentration of nitrogen in the impurity regions 202a and 202b is preferably higher than $5 \times 10^{19}$ atoms/cm$^3$. The concentration of nitrogen in the impurity regions 202a and 202b is measured by secondary ion mass spectrometry (SIMS).

Further, when the concentration of nitrogen in the impurity regions 406a and 406b is higher than or equal to $1 \times 10^{20}$ atoms/cm$^3$ and lower than 7 atoms %, the crystal structure of the impurity regions 406a and 406b may be a wurtzite type structure by performing heat treatment after formation of the impurity regions 406a and 406b. The heat treatment may be performed at a temperature of higher than or equal to 300° C. and lower than or equal to 600° C., preferably higher than or equal to 350° C. and lower than or equal to 500° C.

Note that in this embodiment, an example in which the impurity implantation treatment is performed through the third insulating layer 412 after formation of the impurity regions 406a and 406b is described; however, the present invention is not limited to this. For example, impurities can be implanted into the exposed portion of the oxide semiconductor 406 after formation of the protective insulating layer 410. As described in this embodiment, by the impurity implantation treatment through the insulating layer 412, excessive damage to the oxide semiconductor 406 can be reduced, which is preferable.

Accordingly, in an oxide semiconductor, impurity regions are provided so as to sandwich a channel formation region, so that the energy gap of the impurity regions is smaller than that of the channel formation region; thus, carriers easily flow therein. Therefore, data can be written at high speed by using a transistor having such a structure.

Further, impurity regions are provided so as to sandwich a channel formation region, so that a transistor having a structure in which the concentration of an electric field applied to an end portion of a drain is relieved.

The resistance of the oxide semiconductor 406 is lowered by implanting impurities; therefore, the impurity regions 406a and 406b can also be referred to as low-resistance regions (also referred to as n-type regions).

Next, a fourth insulating layer 414 is formed over the third insulating layer 412 (see FIG. 7C). The material and the manufacturing method which can be used for the fourth insulating layer 414 are similar to those of the fourth insulating layer 212 described in Embodiment 2; thus, description thereof can be referred to.

Through the above steps, the transistor 150 formed using single crystal silicon which is used as an SOI substrate in the peripheral circuit 170 and a transistor 460 formed using, in the memory element 180, an oxide semiconductor different in structure from the transistor 160 described in Embodiment 2 can be formed over the BOX layer 104 which is formed over the supporting substrate 102. The method for connecting an electrode layer 416 and the transistors 150 and 460 is similar to the method for connecting the electrode 214 and the transistors 150 and 160 described in Embodiment 2; thus, description thereof can be referred to.

In the transistor 460 described in this embodiment, the BOX layer 104 over the supporting substrate 102 serves as a dielectric, and a capacitor 490 includes the supporting substrate 102, the BOX layer 104, and the gate electrode 402.

Since the off-state current of the transistor 460 formed using an oxide semiconductor is extremely low, stored data can be held for an extremely long time by using the transistor. That is, power consumption can be sufficiently reduced because refresh operation becomes unnecessary or the frequency of refresh operation can be extremely low. Accordingly, stored data can be held for a long time even when power is not supplied.

Further, by using single crystal silicon which is used as an SOI substrate and utilizing features of a thin single crystal silicon layer formed over an insulating layer, a semiconductor integrated circuit with high added values such as high integration, high-speed driving, and low power consumption can be obtained.

A capacitor can be formed using a supporting substrate, an insulating layer provided over the supporting substrate, and a transistor formed using an oxide semiconductor over the insulating layer. Therefore, it is not required to form a capacitor in the plane direction, so that the circuit size can be reduced.

The methods and structures described in this embodiment can be combined as appropriate with any of the methods and structures described in the other embodiments.

(Embodiment 4)

In this embodiment, examples of a semiconductor device using the transistor described in any of the above embodiments will be described with reference to FIG. 8.

Figure 8:
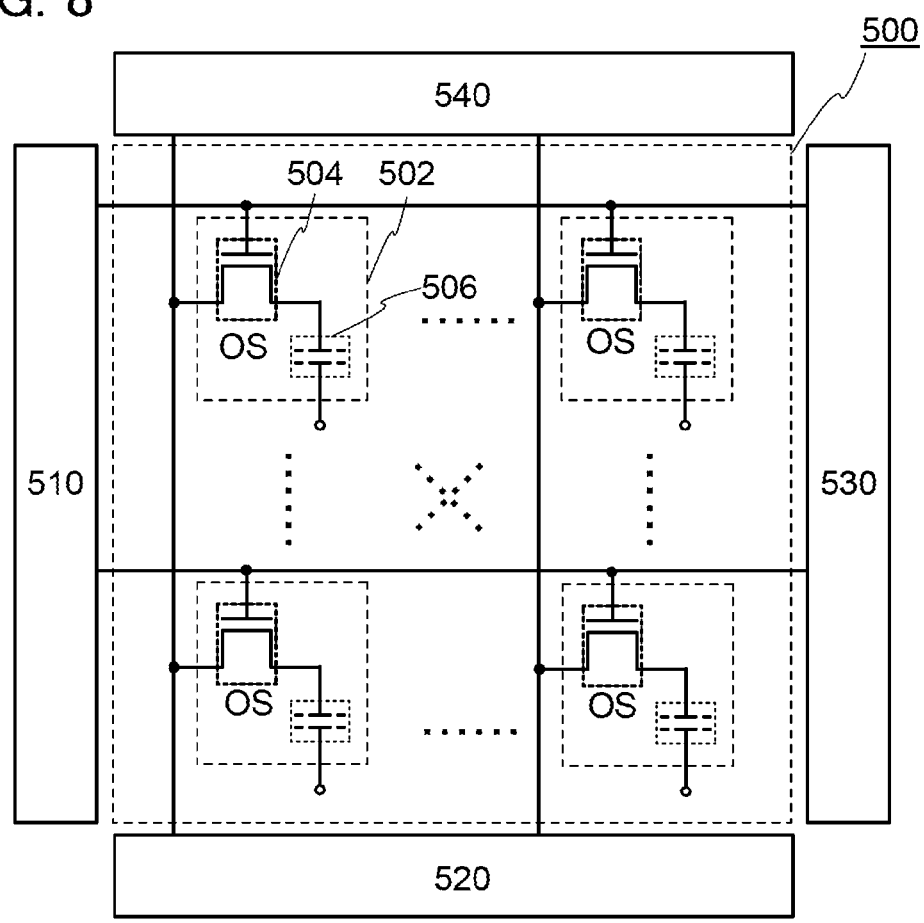
FIG. 8 is a circuit diagram of a semiconductor device.

FIG. 8 shows an example of a semiconductor device having a structure corresponding to a so-called dynamic random access memory (DRAM). A memory cell array 500 shown in FIG. 8, which is a memory element, has a structure in which a plurality of memory cells 502 is arranged in matrix. The memory cell array 500 includes a plurality of first wirings and a plurality of second wirings. Note that the plurality of memory cells 502 correspond to the semiconductor device shown in FIG. 2. Further, the memory cell array 500 is electrically connected to peripheral circuits which include a first driving circuit 510, a second driving circuit 520, a third driving circuit 530, and a fourth driving circuit 540.

The memory cells 502 each include a transistor 504 and a capacitor 506. A gate electrode of the transistor 504 is connected to a first wiring. One of source and drain electrodes of the transistor 504 is connected to a second wiring, and the other of the source and drain electrodes of the transistor 504 is connected to one electrode of the capacitor 506. The other electrode of the capacitor 506 is supplied with a predetermined potential (e.g., a GND potential). The transistor formed using a highly purified oxide semiconductor described in any of the above embodiments is applied to the transistor 504. Further, the capacitor 506 includes a supporting substrate, an insulating layer over the supporting substrate, and a transistor formed using an oxide semiconductor, which are described in any of the above embodiments. The capacitor 506 formed in such a way can be extremely small in size. Thus, the capacitor 506 is shown by a dashed line in FIG. 8.

A transistor formed using single crystal silicon which is used as an SOI substrate described in any of the above embodiments is applied to each of the first driving circuit 510, the second driving circuit 520, the third driving circuit 530, and the fourth driving circuit 540 which are the peripheral circuits.

A transistor formed using the above an oxide semiconductor has a characteristic of extremely small off-state current. Therefore, in the case where the transistor is applied to the semiconductor device described in FIG. 8 which is recognized as a so-called DRAM, a substantially nonvolatile memory can be obtained. Further, high-speed operation of the transistor formed using single crystal silicon which is used as an SOI substrate can be obtained.

Accordingly, a semiconductor device with a novel feature can be obtained by including both a peripheral circuit, such as a driving circuit, including a transistor formed using single crystal silicon which is used as an SOI substrate and a memory element including a transistor formed using an oxide semiconductor.

The methods and structures described in this embodiment can be combined as appropriate with any of the methods and structures described in the other embodiments.

(Embodiment 5)

In this embodiment, the case where the semiconductor device described in any of the above embodiments is applied to an electronic device will be described with reference to FIGS. 9A to 9F. In this embodiment, application of the above-described semiconductor device to electronic devices such as a computer, a cellular phone (also referred to as a mobile phone or a mobile phone set), a personal digital assistant (including a portable game machine, an audio reproducing device, and the like), a camera such as a digital camera or a digital video camera, electronic paper, and a television set (also referred to as a television or a television receiver) will be described.

Figure 9A:
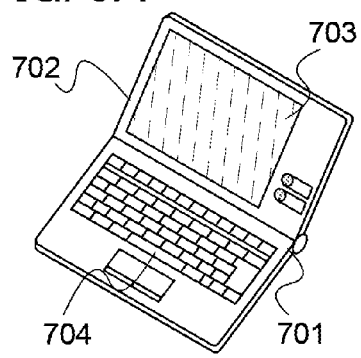
FIGS. 9A to 9F are diagrams illustrating electronic devices each including a semiconductor device.

FIG. 9A illustrates a notebook personal computer, which includes a housing 701, a housing 702, a display portion 703, a keyboard 704, and the like. In each of the housings 701 and 702, the semiconductor device described in any of the above embodiments is provided. Therefore, a laptop personal computer in which writing and reading of data are performed at high speed, data is held for a long time, and power consumption is sufficiently reduced can be obtained.

Figure 9D:
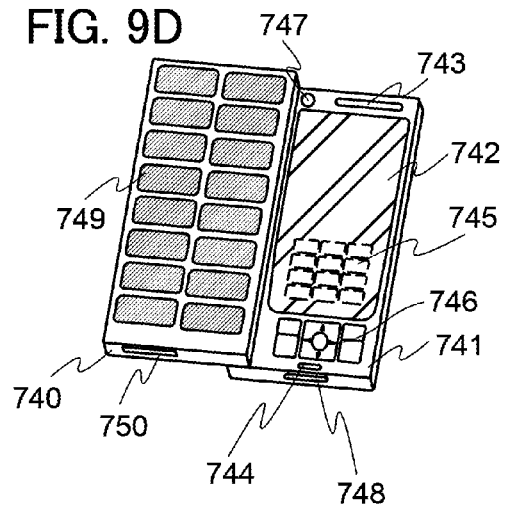
Figure 9B:
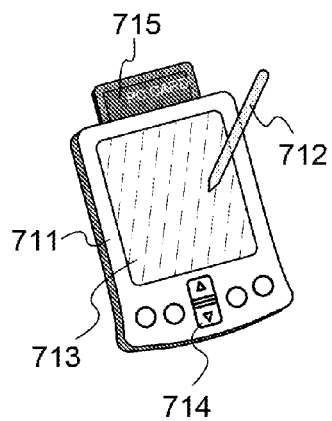

FIG. 9B illustrates a personal digital assistant (PDA). A main body 711 is provided with a display portion 713, an external interface 715, operation buttons 714, and the like. Further, a stylus 712 and the like for operation of the personal digital assistant are provided. In the main body 711, the semiconductor device described in any of the above embodiments is provided. Therefore, a personal digital assistant in which writing and reading of data are performed at high speed, data is held for a long time, and power consumption is sufficiently reduced can be obtained.

Figure 9E:
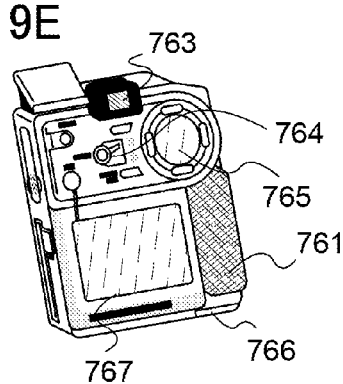
Figure 9C:
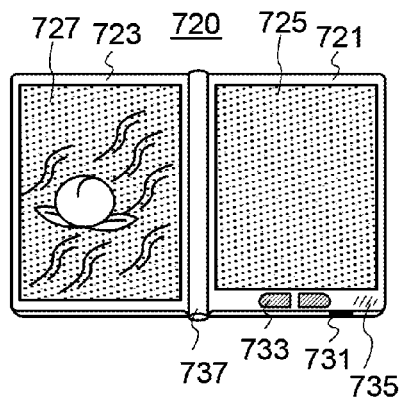

FIG. 9C illustrates an electronic book 720 incorporating electronic paper, which includes two housings: a housing 721 and a housing 723. The housings 721 and 723 are provided with a display portion 725 and a display portion 727, respectively. The housings 721 and 723 are connected by a hinge portion 737 and can be opened or closed with the hinge portion 737. The housing 721 is provided with a power supply 731, an operation key 733, a speaker 735, and the like. At least one of the housings 721 and 723 is provided with the semiconductor device described in any of the above embodiments. Therefore, an e-book reader in which writing and reading of data are performed at high speed, data is held for a long time, and power consumption is sufficiently reduced can be obtained.

FIG. 9D illustrates a cellular phone, which includes two housings: a housing 740 and a housing 741. Moreover, the housings 740 and 741 which are unfolded shown in FIG. 9D can overlap with each other by sliding; thus, the size of the cellular phone can be reduced, which makes the cellular phone suitable for being carried. The housing 741 includes a display panel 742, a speaker 743, a microphone 744, a pointing device 746, a camera lens 747, an external connection terminal 748, and the like. The housing 740 includes a solar cell 749 for charging the cellular phone, an external memory slot 750, and the like. In addition, an antenna is incorporated in the housing 741. At least one of the housings 740 and 741 is provided with the semiconductor device described in any of the above embodiments. Therefore, a cellular phone in which writing and reading of data are performed at high speed, data is held for a long time, and power consumption is sufficiently reduced can be obtained.

FIG. 9E illustrates a digital video camera, which includes a main body 761, a display portion 767, an eyepiece 763, an operation switch 764, a display portion 765, a battery 766, and the like. In the main body 761, the semiconductor device described in any of the above embodiments is provided. Therefore, a digital video camera in which writing and reading of data are performed at high speed, data is held for a long time, and power consumption is sufficiently reduced, can be obtained.

Figure 9F:
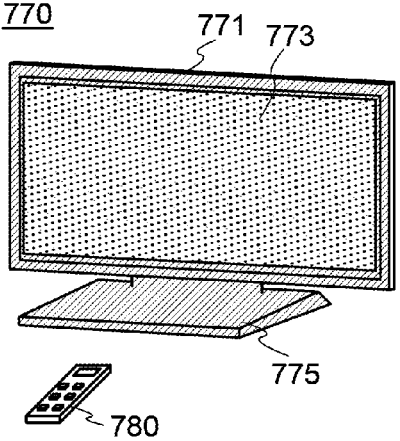

FIG. 9F illustrates a television set 770, which includes a housing 771, a display portion 773, a stand 775, and the like. The television set 770 can be operated with an operation switch of the housing 771 or a remote controller 780. The semiconductor device described in any of the above embodiments is mounted on the housing 771 and the remote controller 780. Therefore, a television set in which writing and reading of data are performed at high speed, data is held for a long time, and power consumption is sufficiently reduced can be obtained.

As described above, the electronic devices described in this embodiment each include the semiconductor device according to any of the above embodiments. Therefore, an electronic device in which reading of data is performed at high speed, data is held for a long time, and power consumption is reduced can be obtained.

The methods and structures described in this embodiment can be combined as appropriate with any of the methods and structures described in the other embodiments.

(Embodiment 6)

In this embodiment, the cases where the semiconductor device described in any of the above embodiments is applied to a portable device such as a mobile phone, a smartphone, and an e-book reader will be described with reference to FIGS. 10A and 10B, FIG. 11, FIG. 12, and FIG. 13.

In portable devices such as a mobile phone, a smartphone, and an e-book reader, an SRAM or a DRAM is used so as to hold image data temporarily. An SRAM or a DRAM is used because a flash memory, whose response is slow, is unsuitable to be used for image processing. However, there are the following features when an SRAM or a DRAM is used to hold image data temporarily.

Figure 10A:
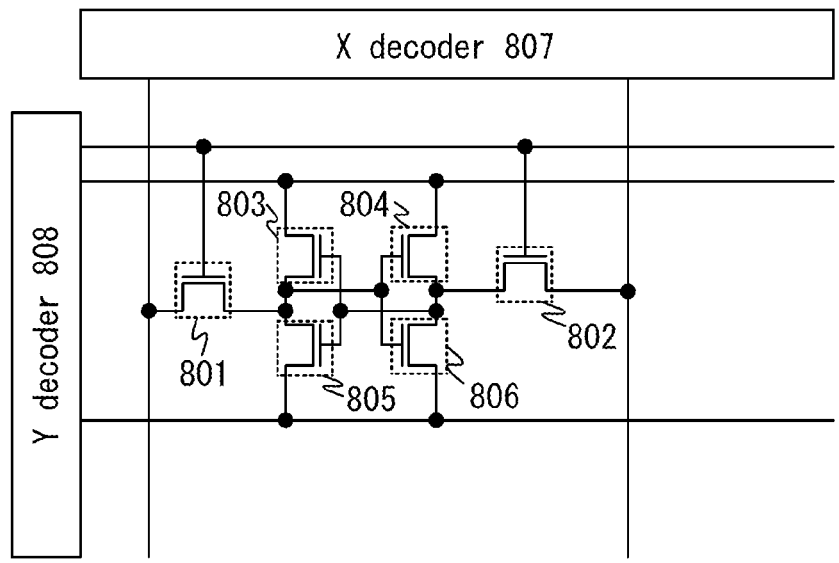
FIGS. 10A and 10B are circuit diagrams of a portable device including a semiconductor device.

In a normal SRAM, as shown in FIG. 10A, one memory cell includes six transistors, which are a transistor 801, a transistor 802, a transistor 803, a transistor 804, a transistor 805, and a transistor 806, and they are driven by an X decoder 807 and a Y decoder 808. The transistors 803 and 805 and the transistors 804 and 806 each serve as an inverter, and high-speed driving can be performed therewith. However, the SRAM has a disadvantage in that the area of a memory cell is large because a memory cell includes six transistors. Provided that the minimum feature size of a design rule is F, the area of a memory cell in an SRAM is generally 100 $F^2$ to 150 $F^2$. Therefore, a price per bit of an SRAM is the most expensive among semiconductor memory devices.

Figure 10B:
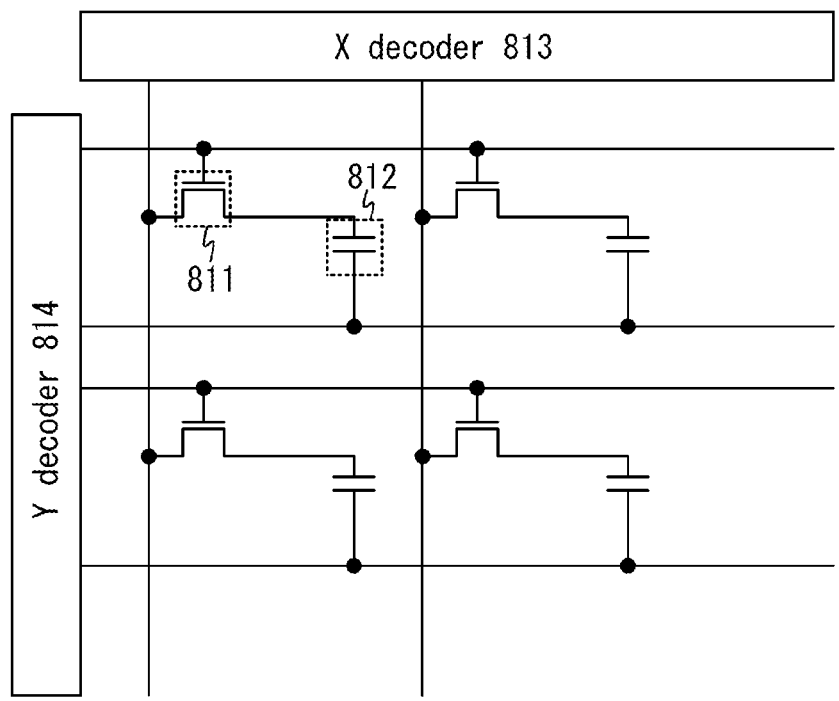

On the other hand, as shown in FIG. 10B, a memory cell in a DRAM includes a transistor 811 and a storage capacitor 812, and is driven by an X decoder 813 and a Y decoder 814. One memory cell includes a transistor and a capacitor, and thus the area thereof is small. The area of a memory cell in a DRAM is normally smaller than or equal to 10 $F^2$. Note that in the case of a DRAM, a refresh operation is always necessary and power is consumed even when a rewriting operation is not performed.

The area of the memory cell in the semiconductor device described in any of the above embodiments is approximately 10 $F^2$, and frequent refreshing which is needed in a conventional DRAM is not necessary. Therefore, the area of the memory cell is reduced, and the power consumption can be reduced.

Figure 11:
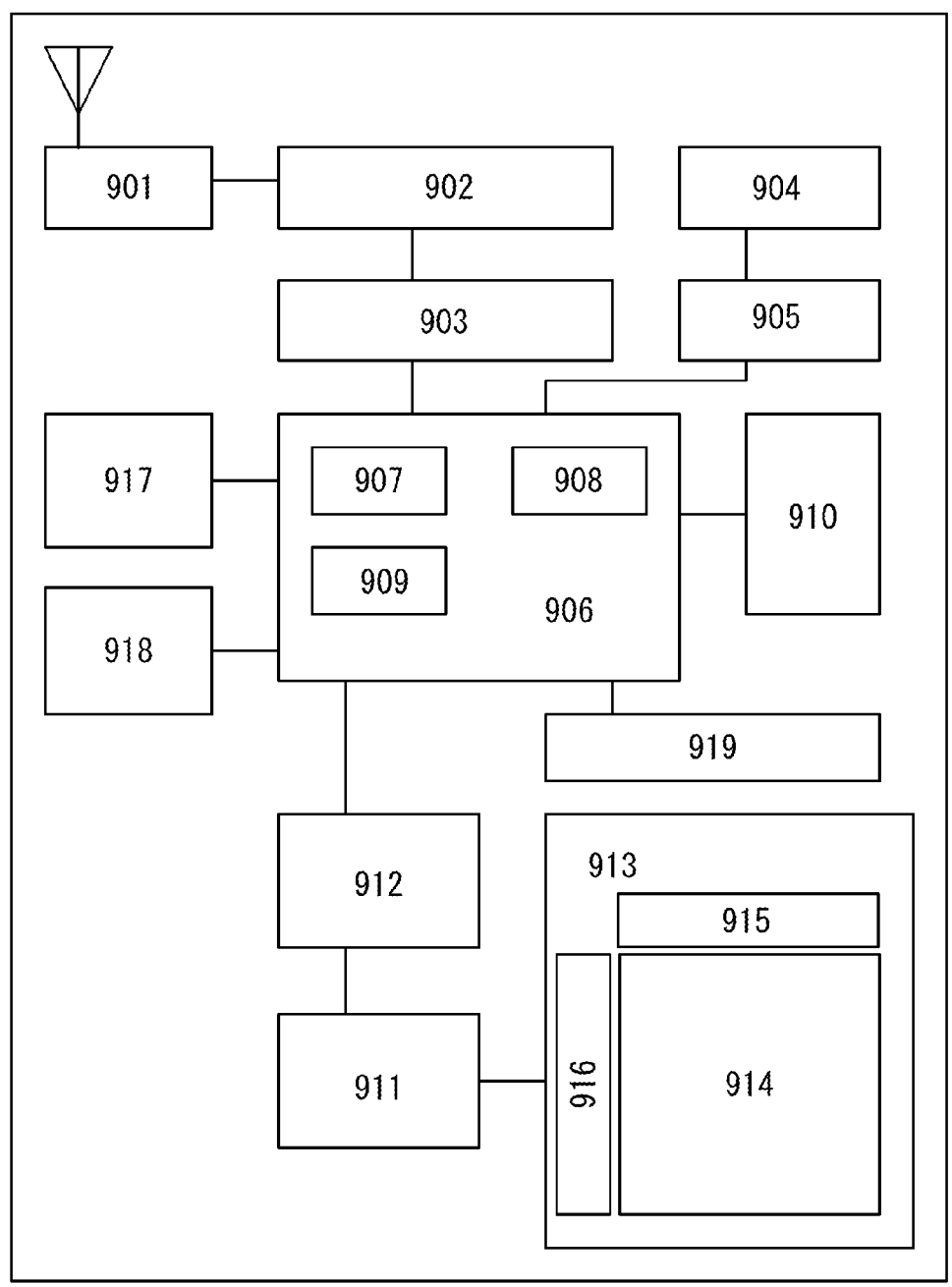
FIG. 11 is a diagram illustrating a portable device including a semiconductor device.

Next, FIG. 11 shows a block diagram of a portable device. A portable device shown in FIG. 11 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface 909 (IF 909).

In general, the memory circuit 912 includes an SRAM or a DRAM; by employing the semiconductor device described in any of the above embodiments for the memory circuit 912, writing and reading of data can be performed at high speed, data can be held for a long time, and power consumption can be sufficiently reduced.

Figure 12:
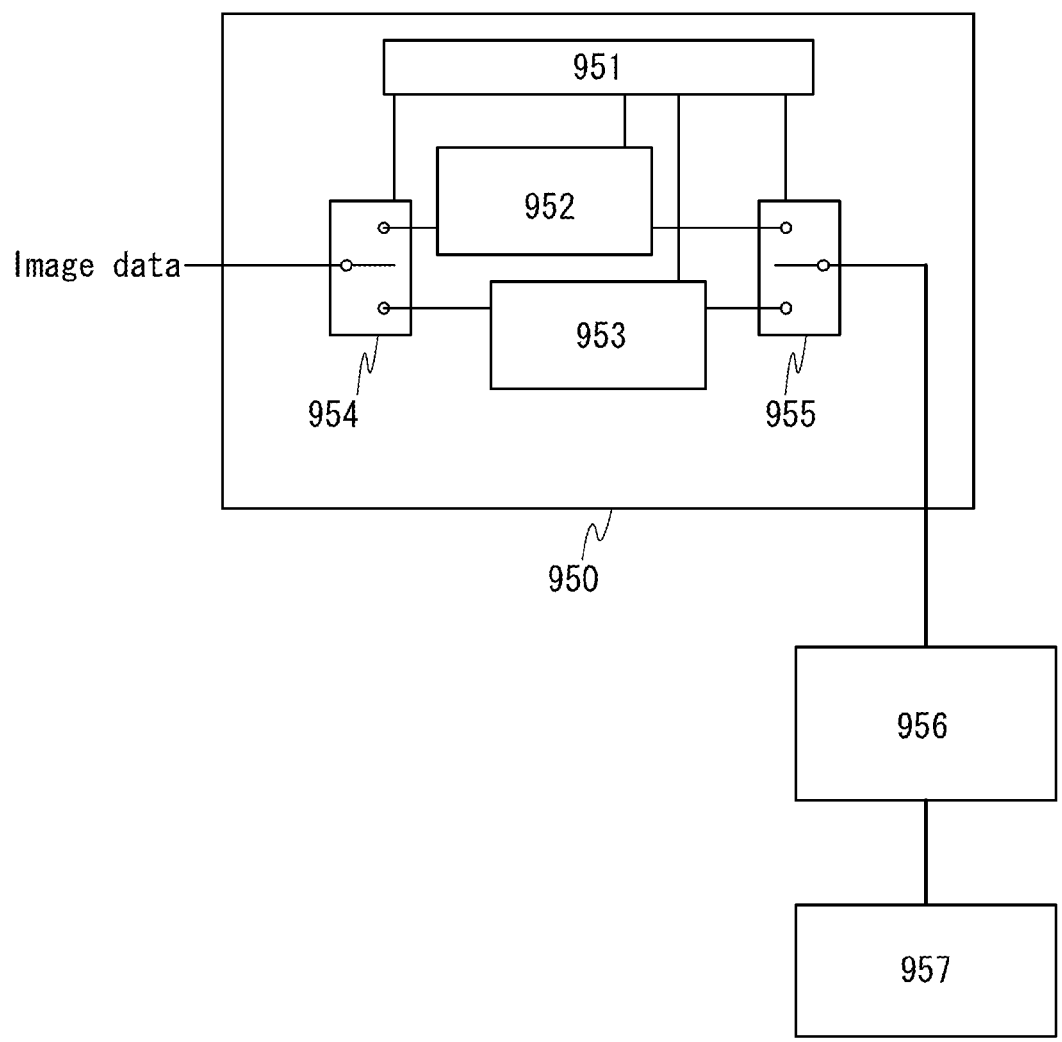
FIG. 12 is a diagram illustrating a portable device including a semiconductor device.

Next, FIG. 12 shows an example in which the semiconductor device described in any of the above embodiments is used for a memory circuit 950 in a display. The memory circuit 950 shown in FIG. 12 includes a memory 952, a memory 953, a switch 954, a switch 955, and a memory controller 951. Further, in the memory circuit, a signal line from image data (input image data), a display controller 956 which reads and controls data held in the memories 952 and 953, and a display 957 which displays data by a signal from the display controller 956 are connected.

First, image data (input image data A) is formed by an application processor (not shown). The input image data A is held in the memory 952 though the switch 954. The image data (stored image data A) held in the memory 952 is transmitted and displayed to the display 957 through the switch 955 and the display controller 956.

In the case where the input image data A is not changed, the stored image data A is read from the display controller 956 through the memory 952 and the switch 955 with a frequency of 30 Hz to 60 Hz in general.

Next, for example, when data displayed on the screen is rewritten by a user (that is, in the case where the input image data A is changed), new image data (input image data B) is formed by the application processor. The input image data B is held in the memory 953 through the switch 954. The stored image data A is read periodically from the memory 952 through the switch 955 even during that time. When storing the new image data (stored image data B) in the memory 953 ends, the stored image data B is read from the frame which is subsequent to the display 957, and transmitted to the display 957 through the switch 955 and the display controller 956. Then, the stored image data B is displayed. This reading operation is continued until another new image data is held in the memory 952.

Accordingly, image data is alternately written and read in the memories 952 and 953, so that the image data is displayed on the display 957. The memories 952 and 953 are not necessarily different memories, and a memory region included in one memory may be divided to be used. When the semiconductor device described in any of the above embodiments is employed for the memories 952 and 953, writing and reading of data can be performed at high speed, data can be held for a long time, and power consumption can be sufficiently reduced.

Figure 13:
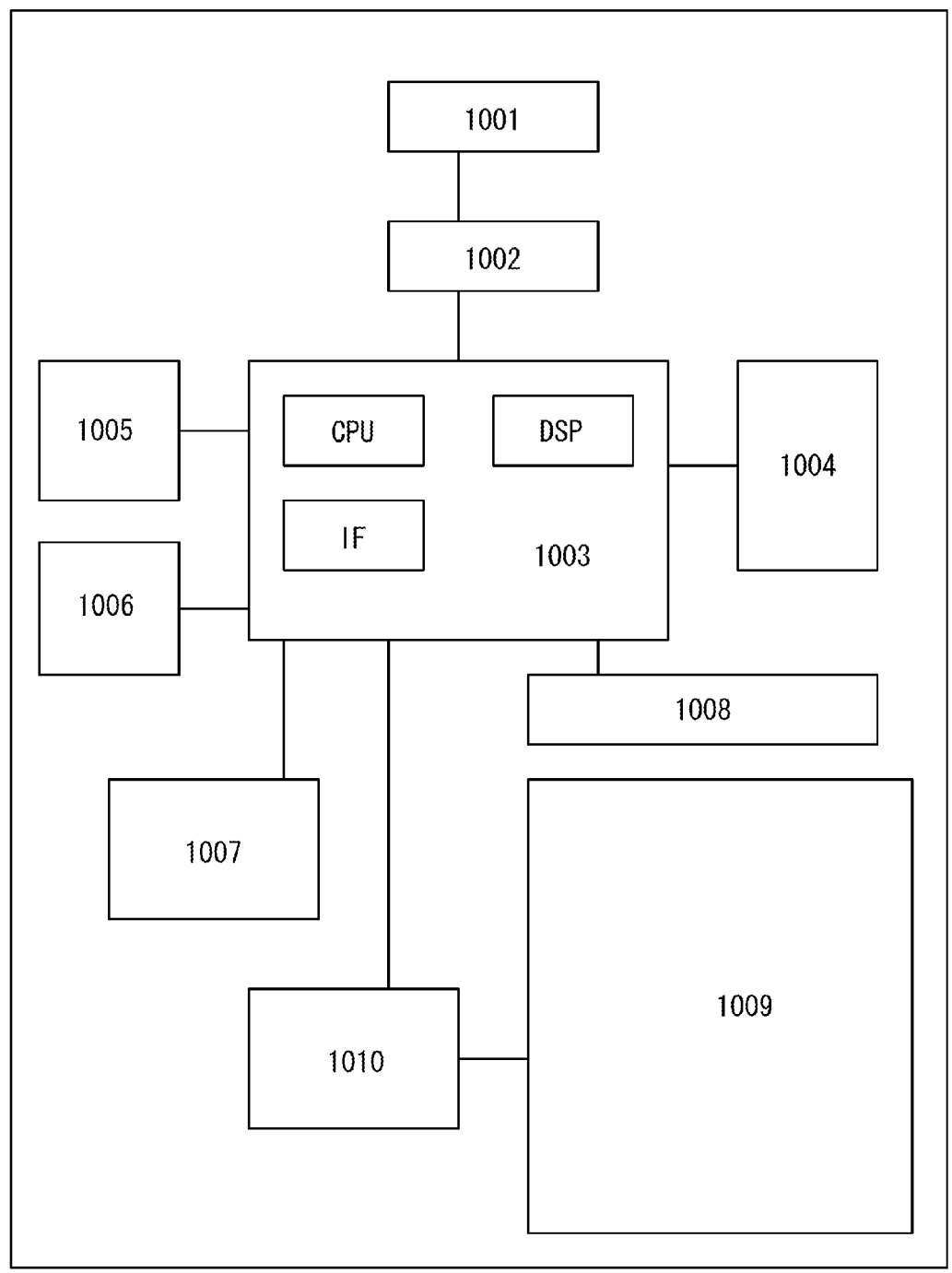
FIG. 13 is a diagram illustrating a portable device including a semiconductor device.

Next, FIG. 13 is a block diagram of an e-book reader. The e-book reader in

FIG. 13 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 13. The memory circuit 1007 has a function of temporarily storing the contents of a book. For example, users use a highlight function in some cases. When users read an e-book reader, they sometimes want to mark a specified place. This marking refers to a highlight function, and users can make difference from other places by, for example, changing the color of a letter displayed, underlining a word, making a letter bold, or changing the font type of a letter. That is, there is a function of storing and holding information of a place specified by users. In order to save information for a long time, the information may be copied into the flash memory 1004. Even in such a case, by employing the semiconductor device described in any of the above embodiments, writing and reading of data can be performed at high speed, data can be held for a long time, and power consumption can be sufficiently reduced.

As described above, the semiconductor device in any of the above embodiments is mounted on each of the portable devices described in this embodiment. Therefore, a portable electric device in which writing and reading of data are performed at high speed, data is held for a long time, and power consumption is sufficiently reduced, can be obtained.

The methods and structures described in this embodiment can be combined as appropriate with any of the methods and structures described in the other embodiments.

This application is based on Japanese Patent Application serial no. 2010-293040 filed with Japan Patent Office on Dec. 28, 2010, the entire contents of which are hereby incorporated by reference.

What is claimed is:

1. A semiconductor device comprising:
a supporting substrate;
an insulating layer over the supporting substrate; and
a driver circuit and a memory element over the insulating layer,
wherein the driver circuit comprises a first transistor including a first channel formation region, the first channel formation region comprising single crystal silicon,
wherein the memory element comprises a second transistor, the second transistor comprising:
an oxide semiconductor layer including a second channel formation region, a first impurity region, and a second impurity region on the insulating layer;
a first gate insulating layer over the oxide semiconductor layer; and
a first gate electrode over the first gate insulating layer, and
wherein the first transistor and the second transistor are electrically connected to each other.

2. The semiconductor device according to claim 1, wherein the first transistor further comprises:
a third impurity region and a fourth impurity region provided with the first channel formation region sandwiched therebetween;
a second gate insulating layer over the first channel formation region;
a second gate electrode over the second gate insulating layer;
a source electrode electrically connected to the third impurity region; and
a drain electrode electrically connected to the fourth impurity region.

3. A semiconductor device comprising:
a supporting substrate;
an insulating layer over the supporting substrate; and
a driver circuit and a memory element over the insulating layer,
wherein the driver circuit comprises a first transistor including a first channel formation region, the first channel formation region comprising single crystal silicon,
wherein the memory element comprises a second transistor, the second transistor comprising:
a first gate electrode on the insulating layer;
a first gate insulating layer over the first gate electrode;
an oxide semiconductor layer including a second channel formation region, a first impurity region, and a second impurity region provided over the first gate insulating layer; and
a protective insulating layer overlapping with the second channel formation region, and
wherein the first transistor and the second transistor are electrically connected to each other.

4. The semiconductor device according to claim 3, wherein the first transistor further comprises:
a third impurity region and a fourth impurity region provided with the first channel formation region sandwiched therebetween;
a second gate insulating layer over the first channel formation region;
a second gate electrode over the second gate insulating layer;
a source electrode electrically connected to the third impurity region; and
a drain electrode electrically connected to the fourth impurity region.

5. A semiconductor device comprising:
a supporting substrate;
an insulating layer over the supporting substrate; and
a driver circuit, a memory element, and a capacitor over the insulating layer,
wherein the driver circuit comprises a first transistor including a first channel formation region, the first channel formation region comprising single crystal silicon,
wherein the memory element comprises a second transistor, the second transistor comprising:
an oxide semiconductor layer including a second channel formation region, a first impurity region and a second impurity region on the insulating layer;
a first gate insulating layer over the oxide semiconductor layer; and
a first gate electrode over the first gate insulating layer,
wherein the capacitor comprises the first impurity region, the second impurity region, the insulating layer, and the supporting substrate, and
wherein the first transistor and the second transistor are electrically connected to each other.

6. The semiconductor device according to claim 5, wherein the first transistor further comprises:
a third impurity region and a fourth impurity region provided with the first channel formation region sandwiched therebetween;
a second gate insulating layer over the first channel formation region;
a second gate electrode over the second gate insulating layer;
a source electrode electrically connected to the third impurity region; and
a drain electrode electrically connected to the fourth impurity region.

7. A semiconductor device comprising:
a supporting substrate;
an insulating layer over the supporting substrate; and
a driver circuit, a memory element, and a capacitor over the insulating layer,
wherein the driver circuit comprises a first transistor including a first channel formation region, the first channel formation region including comprising single crystal silicon,
wherein the memory element comprises a second transistor, the second transistor comprising:
a first gate electrode on the insulating layer;

a first gate insulating layer over the first gate electrode;

an oxide semiconductor layer including a second channel formation region, a first impurity region and a second impurity region over the first gate insulating layer; and a protective insulating layer overlapping with the second channel formation region, wherein the capacitor comprises the first gate electrode, the insulating layer, and the supporting substrate, and wherein the first transistor and the second transistor are electrically connected to each other.

8. The semiconductor device according to claim 7, wherein the first transistor further comprises:

a third impurity region and a fourth impurity region provided with the first channel formation region sandwiched therebetween;

a second gate insulating layer over the first channel formation region;

a second gate electrode over the second gate insulating layer;

a source electrode electrically connected to the third impurity region; and a drain electrode electrically connected to the fourth impurity region.

* * * * *